US012635432B2

(12) United States Patent
Ueda

(10) Patent No.: US 12,635,432 B2
(45) Date of Patent: May 19, 2026

(54) SUBSTRATE TREATING METHOD AND SUBSTRATE TREATING APPARATUS

(71) Applicant: SCREEN Holdings Co., Ltd., Kyoto (JP)

(72) Inventor: Dai Ueda, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 251 days.

(21) Appl. No.: 18/692,792

(22) PCT Filed: May 26, 2022

(86) PCT No.: PCT/JP2022/021554
§ 371 (c)(1),
(2) Date: Mar. 15, 2024

(87) PCT Pub. No.: WO2023/042490
PCT Pub. Date: Mar. 23, 2023

(65) Prior Publication Data
US 2025/0140570 A1 May 1, 2025

(30) Foreign Application Priority Data
Sep. 16, 2021 (JP) ................................. 2021-151056

(51) Int. Cl.
*H01L 21/3213* (2006.01)
*H10P 50/66* (2026.01)
(52) U.S. Cl.
CPC .................................. *H10P 50/667* (2026.01)
(58) Field of Classification Search
None
See application file for complete search history.

(56) References Cited

U.S. PATENT DOCUMENTS

| | | | |
|---|---|---|---|
| 2007/0224760 A1 | 9/2007 | Matsui et al. | |
| 2016/0130500 A1 | 5/2016 | Chen et al. | |
| 2018/0277417 A1* | 9/2018 | Ishii | H01L 21/6708 |
| 2021/0063885 A1* | 3/2021 | Kai | H01L 21/67051 |
| 2021/0072644 A1* | 3/2021 | Choi | G03F 7/325 |

FOREIGN PATENT DOCUMENTS

| | | | |
|---|---|---|---|
| JP | H10-223590 A | 8/1998 | |
| JP | 2007-258510 A | 10/2007 | |
| JP | 2016-527707 A | 9/2016 | |
| JP | 2021-48369 A | 3/2021 | |
| JP | 2021048369 A * | 3/2021 | H01L 21/308 |

OTHER PUBLICATIONS

English Abstract page of JP-2021048369-A; (Year: 2021).*
International Search Report mailed Aug. 9, 2022 in corresponding PCT International Application No. PCT/JP2022/021554.
Written Opinion mailed Jul. 25, 2022 in corresponding PCT International Application No. PCT/JP2022/021554.

* cited by examiner

*Primary Examiner* — Shamim Ahmed
(74) *Attorney, Agent, or Firm* — OSTROLENK FABER LLP

(57) ABSTRACT

This disclosure relates to a substrate treating method and a substrate treating apparatus. The substrate treating method for treating a substrate W includes a switching step and a processing step. In the switching step, an additive agent is switched between an anion surfactant and a cation surfactant. In the processing step, an etching solution is supplied to the substrate W. In the processing step, the additive agent selected in the switching step is supplied to the substrate W.

18 Claims, 9 Drawing Sheets

FIG. 4
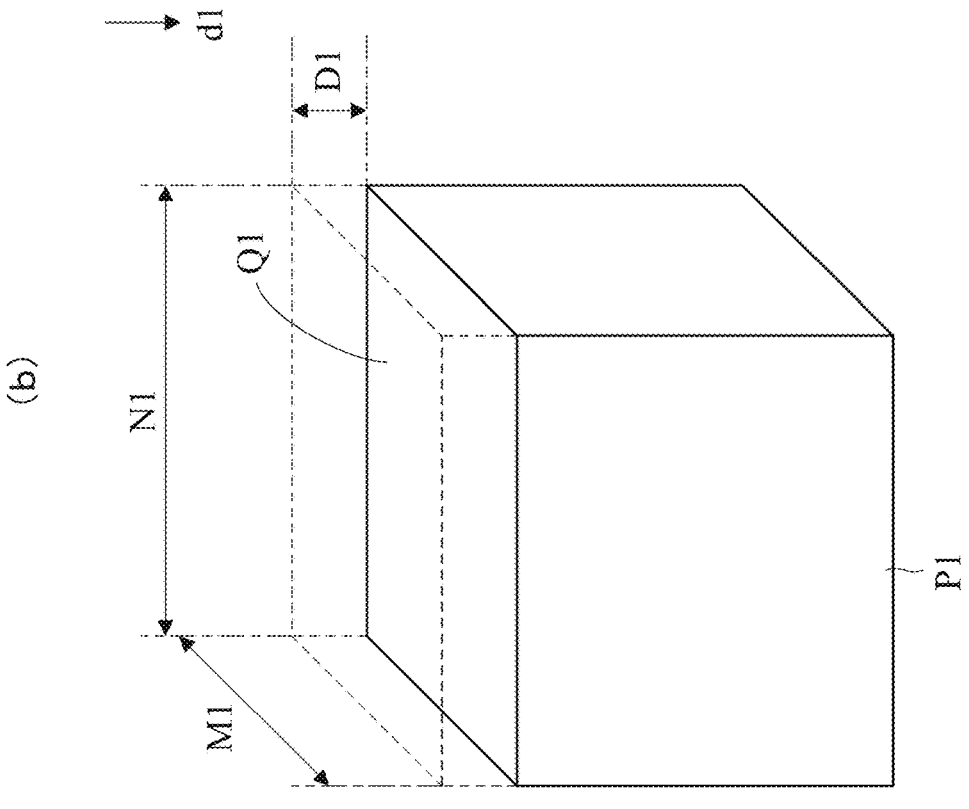
(b)
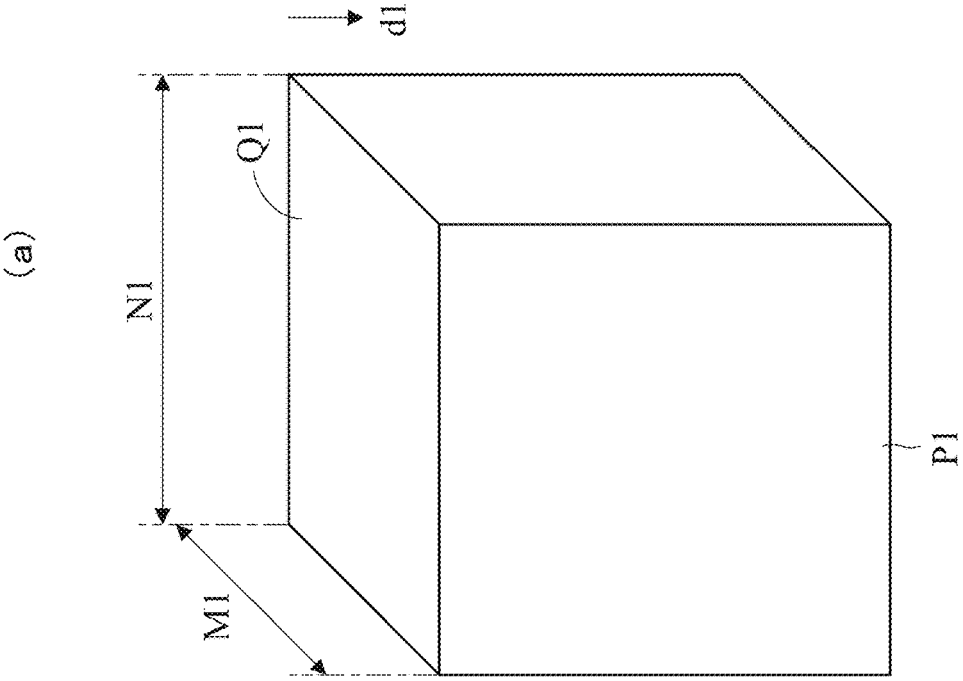
(a)

FIG. 5
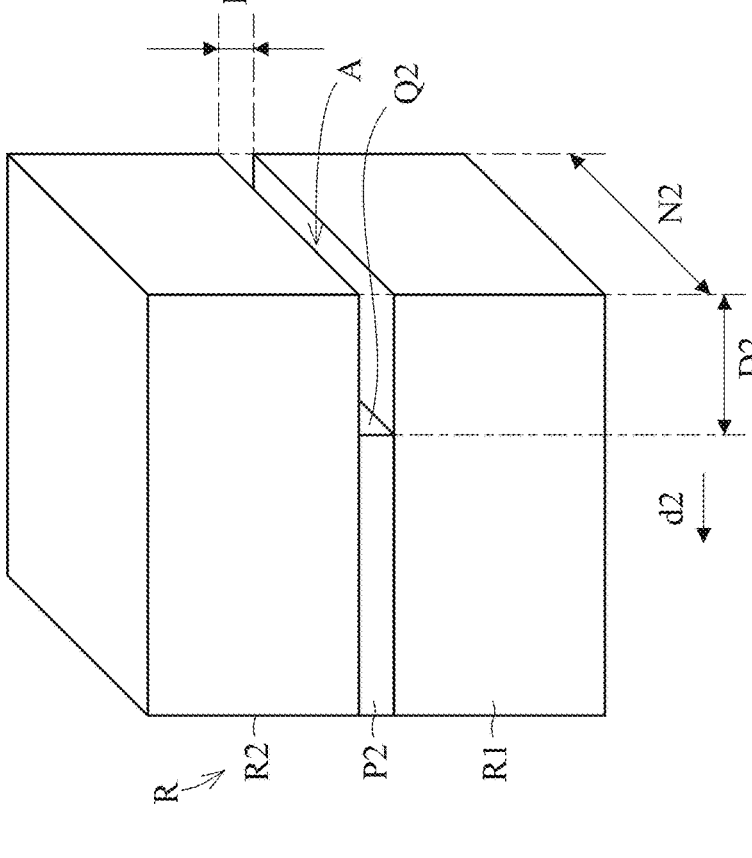
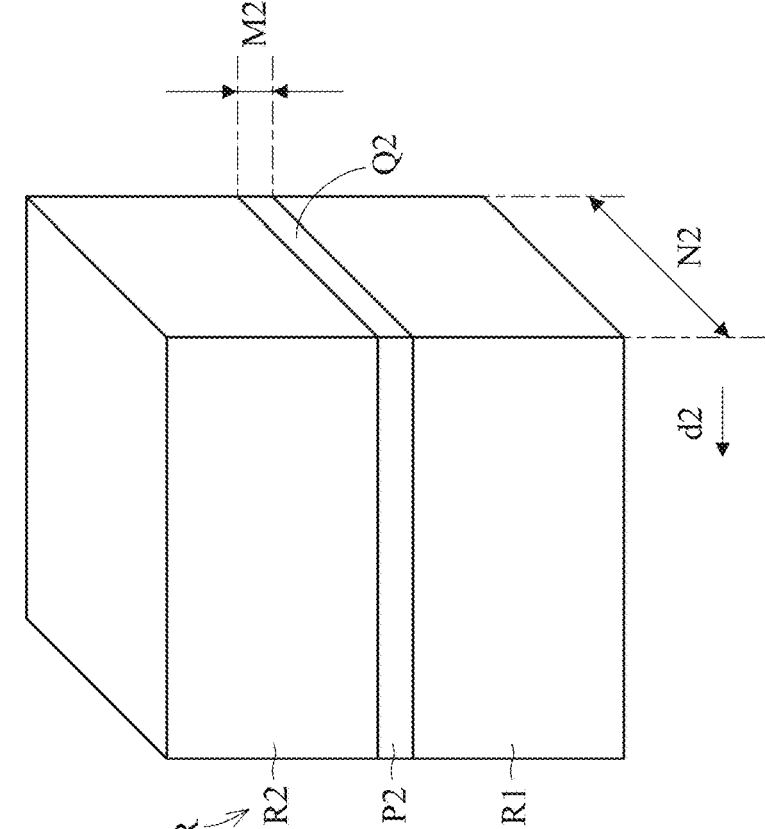

FIG. 7

| | ETCHING SOLUTION | ADDITIVE AGENT | CONCENTRATION [mM] | BLANKET P1 | RECESS A1 (M2=2nm) | | RECESS A2 (M2=5nm) | | RECESS A3 (M2=10nm) | |
|---|---|---|---|---|---|---|---|---|---|---|
| | | | | EB [nm/min] | EA1 [nm/min] | F1 (EA1/EB) | EA2 [nm/min] | F2 (EA2/EB) | EA3 [nm/min] | F3 (EA3/EB) |
| COMPARATIVE EXAMPLE | HYDROGEN PEROXIDE SOLUTION | — | — | 7.7 | 2.20 | 0.286 | 5.56 | 0.722 | 6.73 | 0.874 |
| EXPERIMENTAL EXAMPLE 1 | HYDROGEN PEROXIDE SOLUTION | SDS | 1 | 1.6 | 2.40 | 1.501 | 4.38 | 2.738 | 2.80 | 1.750 |
| EXPERIMENTAL EXAMPLE 2 | HYDROGEN PEROXIDE SOLUTION | SDS | 10 | 0.9 | 1.79 | 1.991 | 3.70 | 4.111 | 4.17 | 4.633 |
| EXPERIMENTAL EXAMPLE 3 | HYDROGEN PEROXIDE SOLUTION | SDS | 100 | 1.3 | 1.40 | 1.074 | 3.48 | 2.677 | 3.88 | 2.985 |
| EXPERIMENTAL EXAMPLE 4 | HYDROGEN PEROXIDE SOLUTION | CTAC | 1 | 4.0 | 0.63 | 0.158 | 0.20 | 0.050 | 1.43 | 0.358 |
| EXPERIMENTAL EXAMPLE 5 | HYDROGEN PEROXIDE SOLUTION | CTAC | 10 | 4.5 | 0.65 | 0.144 | 0.34 | 0.076 | 1.79 | 0.398 |
| EXPERIMENTAL EXAMPLE 6 | HYDROGEN PEROXIDE SOLUTION | CTAC | 100 | 2.8 | 0.89 | 0.318 | 0.42 | 0.150 | 1.48 | 0.529 |

SUBSTRATE TREATING METHOD AND SUBSTRATE TREATING APPARATUS

TECHNICAL FIELD

The present invention relates to a substrate treating method and a substrate treating apparatus for treating substrates. Examples of the substrates include a semiconductor wafer, a substrate for liquid crystal display, a substrate for organic electroluminescence (EL), a substrate for flat panel display (FPD), a substrate for optical display, a magnetic disk substrate, an optical disk substrate, a magneto-optical disk substrate, a substrate for photomask, and a solar cell substrate.

BACKGROUND ART

Patent Literature 1 discloses a substrate treating method that supplies an additive, in addition to an etching solution, to substrates. The additive is an ionic surfactant. The ionic surfactant may be either an anion surfactant or a cation surfactant. With the substrate treating method of Patent Literature 1, an enhanced etching rate in recesses is obtained.

Patent Literature 1 discloses a blanket ratio as an etching rate index. The blanket ratio is a ratio of the etching rate in the recesses of the substrate relative to an etching rate of the blanket portion of the substrate. Ordinally, the etching rate in the recesses is lower than the etching rate of the blanket portion. This normally results in the blanket ratio of less than 1. With the substrate treating method of Patent Literature 1, the etching rate of the blanket portion is not lowered while the etching rate in the recesses becomes high. As a result, with the substrate treating method of Patent Literature 1, the blanket ratio increases to a value of near 1. With the substrate treating method of Patent Literature 1, the blanket ratio increases to a value of near 1 within a range of less than 1.

PRIOR ART DOCUMENT

Patent Literature

[Patent Literature 1]
Japanese Unexamined Patent Publication No. 2021-048369

SUMMARY OF INVENTION

Technical Problem

In recent years, a complex pattern is formed on a surface of a substrate. This also results in complex etching treatment to the substrate.

The present invention has been made regarding the state of the art noted above, and its one object is to provide a substrate treating method and a substrate treating apparatus that enable suitable etching treatment of substrates.

Solution to Problem

The present invention is constituted as stated below to achieve the above object. One aspect of the present invention provides a substrate treating method for performing treatment on a substrate. The substrate treating method includes a switching step of switching an additive agent between an anion surfactant and a cation surfactant, and a processing step of supplying the additive agent, selected in the switching step, and an etching solution to the substrate.

The substrate treating method includes the switching step and the processing step. In the switching step, the additive agent is switched between the anion surfactant and the cation surfactant. In the processing step, the etching solution is supplied to the substrate. In the processing step, the additive agent switched in the switching step is supplied to the substrate. As described above, the additive agent supplied to the substrate in the processing step is switched suitably between the anion surfactant and the cation surfactant. As a result, the substrate is etched suitably in the processing step.

It is preferred in the substrate treating method described above that, in the switching step, either the anion surfactant or the cation surfactant is selected as the additive agent in accordance with processing condition information for defining a condition of the processing step. The additive agent supplied to the substrate in the processing step is switched more suitably between the anion surfactant and the cation surfactant. Consequently, the substrate is etched more suitably.

It is preferred in the substrate treating method described above that the processing condition information contains additive agent information that specifies the either the anion surfactant or the cation surfactant as the additive agent, and that the additive agent is switched between the anion surfactant and the cation surfactant in accordance with the additive agent information in the switching step. The additive agent supplied to the substrate in the processing step is switched more suitably between the anion surfactant and the cation surfactant. Consequently, the substrate is etched more suitably.

It is preferred in the substrate treating method described above that the substrate has a blanket portion and that the blanket portion is positively charged when the etching solution is supplied to the substrate. When the etching solution and the anion surfactant are supplied to the substrate, the anion surfactant has polarity opposite to that of the blanket portion. Accordingly, the blanket portion and the anion surfactant attract each other. The anion surfactant concentrates in the vicinity of the blanket portion. Consequently, the anion surfactant prevents etching of the blanket portion with the etching solution. That is, the anion surfactant satisfactorily avoids etching of the blanket portion. When the etching solution and the cation surfactant are supplied to the substrate, the cation surfactant has same polarity as that of the blanket portion. Accordingly, the blanket portion and the cation surfactant repeal each other. The cation surfactant does not concentrate in the vicinity of the blanket portion. Consequently, the cation surfactant does not prevent etching of the blanket portion with the etching solution. That is, the cation surfactant satisfactorily permits etching of the blanket portion. As described above, switching the additive agent between the anion surfactant and the cation surfactant causes suitable control of the etching rate of the blanket portion.

It is preferred in the substrate treating method described above that the substrate has a wall defining a recess, and that the wall is negatively charged when the etching solution is supplied to the substrate. When the etching solution and the anion surfactant are supplied to the substrate, the anion surfactant has same polarity as that of the wall. Accordingly, the wall and the anion surfactant repeal each other. It is difficult for the anion surfactant to enter the recess. Consequently, the anion surfactant does not prevent etching inside of the recess with the etching solution. That is, the anion surfactant satisfactorily permits etching inside of the recess. When the etching solution and the cation surfactant are supplied to the substrate, the cation surfactant has polarity opposite to that of the wall. Accordingly, the wall and the cation surfactant attract each other. It is easy for the cation surfactant to enter the recess. Consequently, the cation surfactant prevents etching inside of the recess with the etching solution. That is, the cation surfactant satisfactorily avoids etching inside of the recess. As described above, switching the additive agent between the anion surfactant and the cation surfactant causes suitable control of the etching rate in the recess.

It is preferred in the substrate treating method described above that the etching solution is acid. When the etching solution is supplied to the substrate, the blanket portion is positively charged satisfactorily. When the etching solution is supplied to the substrate, the wall of the substrate defining the recess is negatively charged satisfactorily.

It is preferred in the substrate treating method described above that, in the switching step, one of the anion surfactant and the cation surfactant is selected as the additive agent when the processing condition information specifies a first etching condition, and the other of the anion surfactant and the cation surfactant is selected as the additive agent when the processing condition information specifies a second etching condition, and that the first etching condition is to etch an inside of the recess of the substrate while protecting the blanket portion of the substrate from etching, and the second etching condition is to etch the blanket portion of the substrate while protecting the recess of the substrate from etching. The additive agent supplied to the substrate in the processing step is switched more suitably between the anion surfactant and the cation surfactant. Consequently, the substrate is etched more suitably. For example, whether the etching of the blanket portion or protection of the blanket portion from etching is controlled suitably. For example, whether the etching inside of the recess or protection of the recess from etching is controlled suitably.

It is preferred in the substrate treating method described above that the blanket portion is positively charged when the etching solution is supplied to the substrate and the wall of the substrate defining the recess is negatively charged, and that, in the switching step, the anion surfactant is selected as the additive agent when the processing condition information specifies the first etching condition and the cation surfactant is selected as the additive agent when the processing condition information specifies the second etching condition.

When the processing condition information specifies the first etching condition, the anion surfactant and the etching solution are supplied to the substrate in the processing step. When the etching solution is supplied to the substrate, the blanket portion is positively charged. The anion surfactant and the blanket portion attract each other. Accordingly, the anion surfactant prevents etching of the blanket portion. That is, the anion surfactant protects the blanket portion from the etching. When the etching solution is supplied to the substrate, the wall is negatively charged. The anion surfactant and the wall repeal each other. Accordingly, the anion surfactant permits etching inside of the recess. This results in easy etching of the substrate under the first etching condition in the processing step.

When the processing condition information specifies the second etching condition, the cation surfactant and the etching solution are supplied to the substrate in the processing step. The cation surfactant and the blanket portion repeal each other. Accordingly, the cation surfactant permits etching of the blanket portion. The cation surfactant and the wall attract each other. Accordingly, the cation surfactant prevents etching inside of the recess. That is, the cation surfactant protects the recess from the etching. This results in easy etching of the substrate under the second etching condition in the processing step.

It is preferred in the substrate treating method described above that, in the switching step, either the anion surfactant or the cation surfactant is selected as the additive agent in accordance with a target about at least either an etching rate of the blanket portion of the substrate or an etching rate in the recess of the substrate. The additive agent supplied to the substrate in the processing step is switched more suitably between the anion surfactant and the cation surfactant. Consequently, the substrate is etched more suitably.

It is preferred in the substrate treating method described above that, in the switching step, one of the anion surfactant and the cation surfactant is selected as the additive agent when the target is to bring the etching rate of the blanket portion close to zero, and that the other of the anion surfactant and the cation surfactant is selected as the additive agent when the target is to bring the etching rate in the recess close to zero. The additive agent supplied to the substrate in the processing step is switched more suitably between the anion surfactant and the cation surfactant. Consequently, the substrate is etched more suitably. For example, the etching rate of the blanket portion is controlled suitably. For example, the etching rate in the recess is controlled suitably.

It is preferred in the substrate treating method described above that the blanket portion is positively charged and the wall of the substrate defining the recess is negatively charged when the etching solution is supplied to the substrate, and that, in the switching step, the anion surfactant is selected as the additive agent when the target is to bring the etching rate of the blanket portion close to zero, and the cation surfactant is selected as the additive agent when the target is to bring the etching rate in the recess close to zero.

When the target is to bring the etching rate of the blanket portion close to zero, the anion surfactant and the etching solution are supplied to the substrate in the processing step. When the etching solution is supplied to the substrate, the blanket portion is positively charged. The anion surfactant and the blanket portion attract each other. Accordingly, the anion surfactant prevents etching of the blanket portion. That is, the anion surfactant reduces the etching rate of the blanket portion. As a result, the target that the etching rate of the blanket portion is brought close to zero is achieved easily in the processing step.

When the target is to bring the etching rate in the recess close to zero, the cation surfactant and the etching solution are supplied to the substrate in the processing step. When the etching solution is supplied to the substrate, the wall is negatively charged. The cation surfactant and the wall attract each other. Accordingly, the cation surfactant prevents etching inside of the recess. That is, the cation surfactant reduces the etching rate in the recess. As a result, the target to bring the etching rate in the recess close to zero is achieved easily in the processing step.

It is preferred in the substrate treating method described above that, in the switching step, one of the anion surfactant and the cation surfactant is selected as the additive agent when the target is to make the etching rate of the blanket portion lower than the etching rate in the recess, and the other of the anion surfactant and the cation surfactant is selected as the additive agent when the target is to make the etching rate in the recess lower than the etching rate of the blanket portion. The additive agent supplied to the substrate is switched more suitably between the anion surfactant and the cation surfactant. Consequently, the substrate is etched more suitably. For example, a level relationship between the etching rate of the blanket portion and the etching rate in the recess in the processing step is switched suitably.

It is preferred in the substrate treating method described above that the blanket portion is positively charged and the wall of the substrate defining the recess is negatively charged when the etching solution is supplied to the substrate, and that, in the switching step, the anion surfactant is selected as the additive agent when the target is to make the etching rate of the blanket portion lower than the etching rate in the recess, and the cation surfactant is selected as the additive agent when the target is to make the etching rate in the recess is made lower than the etching rate of the blanket portion.

When the target is to make the etching rate of the blanket portion lower than the etching rate in the recess, the anion surfactant and the etching solution are supplied to the substrate in the processing step. When the etching solution is supplied to the substrate, the blanket portion is positively charged. The anion surfactant and the blanket portion attract each other. Accordingly, the anion surfactant prevents etching of the blanket portion. When the etching solution is supplied to the substrate, the wall is negatively charged. The anion surfactant and the wall repeal each other. Accordingly, the anion surfactant permits etching inside of the recess. From these results, the target to make the etching rate of the blanket portion lower than the etching rate in the recess is achieved easily in the processing step.

When the target is to make the etching rate in the recess lower than the etching rate of the blanket portion, the cation surfactant and the etching solution are supplied to the substrate in the processing step. The cation surfactant and the blanket portion repeal each other. Accordingly, the cation surfactant permits etching of the blanket portion. The cation surfactant and the wall attract each other. Accordingly, the cation surfactant prevents etching inside of the recess. From these results, the target to make the etching rate in the recess is made lower than the etching rate of the blanket portion is achieved easily in the processing step.

It is preferred in the substrate treating method described above that, in the switching step, either the anion surfactant or the cation surfactant is selected as the additive agent in accordance with a target about a blanket ratio, and that the blanket ratio is a ratio of the etching rate in the recess of the substrate relative to the etching rate of the blanket portion of the substrate. The additive agent supplied to the substrate is switched more suitably between the anion surfactant and the cation surfactant. Consequently, the substrate is etched more suitably.

It is preferred in the substrate treating method described above that, in the switching step, one of the anion surfactant and the cation surfactant is selected as the additive agent when the target is to make the blanket ratio higher than a reference value, and that the other of the anion surfactant and the cation surfactant is selected as the additive agent when the target is to make the blanket ratio lower than a reference value, and that the reference value is a blanket ratio obtained when the etching solution is supplied to the substrate while the additive agent is not supplied to the substrate. The additive agent supplied to the substrate in the processing step is switched more suitably between the anion surfactant and the cation surfactant. Consequently, the substrate is etched more suitably. For example, the blanket ratio in the processing step is controlled suitably.

It is preferred in the substrate treating method described above that the blanket portion is positively charged and the wall of the substrate defining the recess is negatively charged when the etching solution is supplied to the substrate, that, in the switching step, the anion surfactant is selected as the additive agent when the target is to make the blanket ratio higher than the reference value, and the cation surfactant is selected as the additive agent when the target is to make the blanket ratio lower than the reference value.

When the target is to make the blanket ratio higher than the reference value, the anion surfactant and the etching solution are supplied to the substrate in the processing step. When the etching solution is supplied to the substrate, the blanket portion is positively charged. The anion surfactant and the blanket portion attract each other. Accordingly, the anion surfactant prevents etching of the blanket portion. When the etching solution is supplied to the substrate, the wall is negatively charged. The anion surfactant and the wall repeal each other. Accordingly, the anion surfactant permits etching inside of the recess. From these results, the target that the blanket ratio is made higher than the reference value is achieved easily in the processing step.

When the target is to make the blanket ratio lower than the reference value, the cation surfactant and the etching solution are supplied to the substrate in the processing step. The cation surfactant and the blanket portion repeal each other. Accordingly, the cation surfactant permits etching of the blanket portion. The cation surfactant and the wall attract each other. Accordingly, the cation surfactant prevents etching inside of the recess. From these results, the target that the blanket ratio is made lower than the reference value is achieved easily in the processing step.

It is preferred in the substrate treating method described above that, in the switching step, one of the anion surfactant and the cation surfactant is selected as the additive agent when the target is to make the blanket ratio higher than 1, and the other of the anion surfactant and the cation surfactant is selected as the additive agent when the target is to bring the blanket ratio close to zero. The additive agent supplied to the substrate in the processing step is switched more suitably between the anion surfactant and the cation surfactant. Consequently, the substrate is etched more suitably. For example, the blanket ratio in the processing step is controlled more flexibly.

It is preferred in the substrate treating method described above that the blanket portion is positively charged and the wall of the substrate defining the recess is negatively charged when the etching solution is supplied to the substrate, and that, in the switching step, the anion surfactant is selected as the additive agent when the target is to make the blanket ratio higher than 1, and the cation surfactant is selected as the additive agent when the target is to bring the blanket ratio close to zero.

When the target is to make the blanket ratio higher than 1, the anion surfactant and the etching solution are supplied to the substrate in the processing step. When the etching solution is supplied to the substrate, the blanket portion is positively charged. The anion surfactant and the blanket portion attract each other. Accordingly, the anion surfactant prevents etching of the blanket portion. When the etching solution is supplied to the substrate, the wall is negatively charged. The anion surfactant and the wall repeal each other. Accordingly, the anion surfactant permits etching inside of the recess. From these results, the target that the blanket ratio is made higher than 1 is achieved easily in the processing step.

When the target is to bring the blanket ratio close to zero, the cation surfactant and the etching solution are supplied to the substrate in the processing step. The cation surfactant and the blanket portion repeal each other. Accordingly, the cation surfactant permits etching of the blanket portion. The cation surfactant and the wall attract each other. Accordingly, the cation surfactant prevents etching inside of the recess. From these results, the target that the blanket ratio is brought close to zero is achieved easily in the processing step.

It is preferred in the substrate treating method described above that the etching solution is a hydrogen peroxide solution. With the hydrogen peroxide solution, the substrate is etched suitably.

It is preferred in the substrate treating method described above that the substrate treated in the processing step has a blanket portion made of titanium nitride. When the anion surfactant and the hydrogen peroxide solution are supplied to the substrate, the blanket portion and the anion surfactant attract each other. Accordingly, the anion surfactant satisfactorily protects the blanket portion, made of titanium nitride, from the hydrogen peroxide solution. Consequently, the anion surfactant satisfactorily prevents etching of the blanket portion, made of titanium nitride, with the hydrogen peroxide solution. When the cation surfactant and the hydrogen peroxide solution are supplied to the substrate, the blanket portion and the cation surfactant repeal each other. Consequently, the cation surfactant suitably permits etching of the blanket portion, made of titanium nitride, with the hydrogen peroxide solution.

It is preferred in the substrate treating method described above that the substrate treated in the processing step has a wall that defines a recess and is made of at least one selected from silicon, silicon dioxide, polysilicon, and hafnium oxide. When the anion surfactant and the hydrogen peroxide solution are supplied to the substrate, the anion surfactant permits etching inside of the recess with the hydrogen peroxide solution suitably. When the cation surfactant and the hydrogen peroxide solution are supplied to the substrate, the cation surfactant protects the recess from the hydrogen peroxide solution suitably. When the wall is made of at least one selected from silicon, silicon dioxide, polysilicon, and hafnium oxide, the cation surfactant prevents etching inside of the recess with the hydrogen peroxide solution suitably.

It is preferred in the substrate treating method described above that the substrate treated in the processing step has a first wall, a second wall and an intermediate part located between the first wall and the second wall and made of titanium nitride, and that the intermediate part is etched but the first wall and the second wall are not etched, and a recess is formed between the first wall and the second wall in the processing step. When the anion surfactant and the hydrogen peroxide solution are supplied to the substrate, the anion surfactant permits etching of the intermediate part, made of titanium nitride, with the hydrogen peroxide solution suitably. Consequently, the anion surfactant more suitably permits etching inside of the recess with the hydrogen peroxide solution.

It is preferred that the substrate treating method described above further includes an adjusting step of changing a set value of a concentration of the additive agent relative to the etching solution, and that, in the processing step, the additive agent selected in the switching step is supplied to the substrate at a concentration equal to the set value determined in the adjusting step. The concentration of the additive agent supplied to the substrate in the processing step is variable suitably. Consequently, the substrate is etched more suitably.

Another aspect of the present invention provides a substrate treating apparatus. The substrate treating apparatus includes a substrate holder configured to hold a substrate, a supplying unit configured to supply an etching solution and an additive agent to the substrate held by the substrate holder, and a controller configured to control the supplying unit for switching the additive agent between an anion surfactant and a cation surfactant.

The substrate treating apparatus includes the substrate holder, the supplying unit, and the controller. The substrate holder holds the substrate. The supplying unit supplies the etching solution to the substrate held by the substrate holder. The supplying unit supplies the additive agent to the substrate held by the substrate holder. The controller controls the supplying unit. The controller causes switching of the additive agent between the anion surfactant and the cation surfactant. Accordingly, the additive agent supplied to the substrate is switched suitably between the anion surfactant and the cation surfactant. Consequently, the substrate is etched suitably.

Advantageous Effects of Invention

With the substrate treating method and the substrate treating apparatus according to the present invention, substrates are etched suitably.

BRIEF DESCRIPTION OF DRAWINGS

FIG. 4(*a*) and FIG. 4(*b*) each schematically show a blanket portion.

FIG. 5(*a*) and FIG. 5(*b*) each schematically show a recess.

FIG. 7 is a table of a comparative example and experimental examples 1 to 6.

DESCRIPTION OF EMBODIMENTS

The following describes a substrate treating method and a substrate treating apparatus of the present invention with reference to the drawings.

<1. Summary of Substrate Treating Apparatus>

Figure 1:
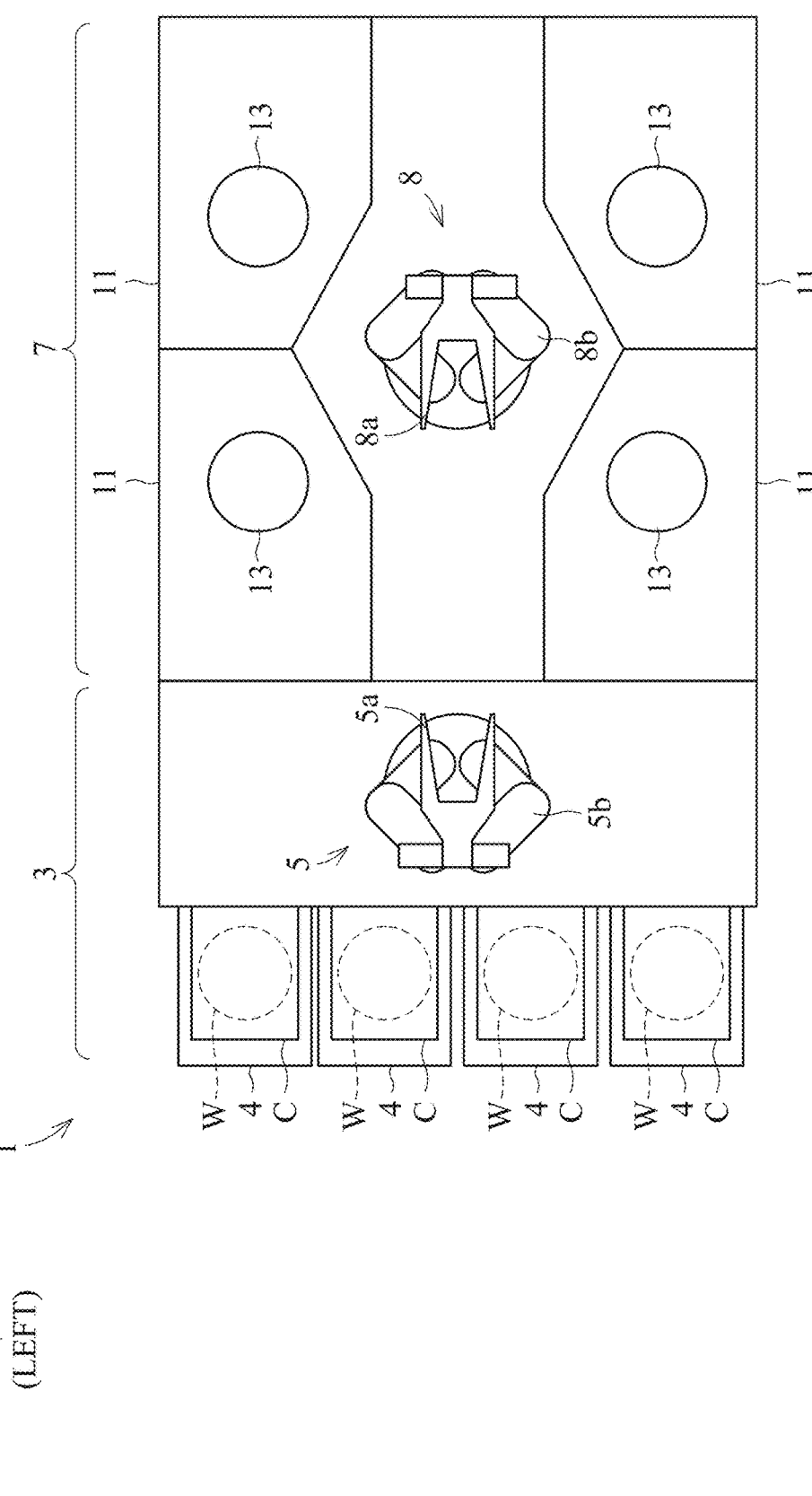
FIG. 1 is a plan view of an interior of a substrate treating apparatus.

FIG. 1 is a plan view of an interior of a substrate treating apparatus 1. The substrate treating apparatus 1 performs treatment on a substrate W. The treatment performed by the substrate treating apparatus 1 includes wet etching treatment.

Examples of the substrate W include a semiconductor wafer, a substrate for liquid crystal display, a substrate for organic electroluminescence (EL), a substrate for flat panel display (FPD), a substrate for optical display, a magnetic disk substrate, an optical disk substrate, a magneto-optical disk substrate, a substrate for photomask, and a solar cell substrate. The substrate W has a thin and flat plate shape. The substrate W has a substantially circular shape in plan view.

The substrate treating apparatus 1 includes an indexer 3, and a treating block 7. The treating block 7 is connected to the indexer 3. The indexer 3 supplies a substrate W to the treating block 7. The treating block 7 performs a treatment to the substrate W. The indexer 3 collects the substrate W from the treating block 7.

In this specification, the direction in which the indexer 3 and the treating block 7 are arranged is referred to as a "front-back direction X" for convenience. The front-back direction X is horizontal. One direction of the front-back direction X from the treating block 7 to the indexer 3 is referred to as a "forward direction". The direction opposite to the forward direction is referred to as a "rearward direction". A horizontal direction orthogonal to the front-back direction X is referred to as a "width direction Y". Moreover, one direction of the transverse direction Y is referred to as "rightward", as appropriate. The direction opposite to right-ward is referred to as "leftward". The perpendicular direction relative to the horizontal direction is referred to as a "vertical direction Z". For reference, the drawings show front, rear, right, left, up, and down, as appropriate.

The indexer 3 includes a plurality of (e.g., four) carrier platforms 4. The carrier platforms 4 each include one carrier C placed thereon. The carrier C accommodates a plurality of substrates W. The carrier C is, for example, a front opening unified pod (FOUP), a standard mechanical interface (SMIF), or an open cassette (OC).

The indexer 3 includes a transport mechanism 5. The transport mechanism 5 is arranged rearward of the carrier platforms 4. The transport mechanism 5 transports sub-strates W. The transport mechanism 5 can access the carriers C placed on the carrier platforms 4, respectively. The transport mechanism 5 includes a hand 5a and a hand driving unit 5b. The hand 5a supports a substrate W. The hand driving unit 5b is coupled to the hand 5a. The hand driving unit 5b moves the hand 5a. The hand driving unit 5b moves the hand 5a in the front-back direction X, transverse direction Y, and vertical direction Z, for example. The hand driving unit 5b rotates the hand 5a in a horizontal plane, for example.

The treating block 7 includes a transport mechanism 8. The transport mechanism 8 transports substrates W. The substrates W can be delivered between the transport mechanism 5 and the transport mechanism 8. The transport mechanism 8 includes a hand 8a and a hand driving unit 8b. The hand 8a supports a substrate W. The hand driving unit 8b is coupled to the hand 8a. The hand driving unit 8b moves the hand 8a. The hand driving unit 8b moves the hand 8a in the front-back direction X, transverse direction Y, and vertical direction Z, for example. The hand driving unit 8b rotates the hand 8a in a horizontal plane, for example.

The treating block 7 includes a plurality of treating units 11. The treating units 11 are arranged laterally of the transport mechanism 8. The treating units 11 each perform treatment on a substrate W individually.

The treating unit 11 includes a substrate holder 13. The substrate holder 13 holds a substrate W.

The transport mechanism 8 is accessible to the treating units 11 individually. The transport mechanism 8 can deliver the substrate W onto the substrate holder 13. The transport mechanism 8 can take the substrate W from the substrate holder 13.

Figure 2:
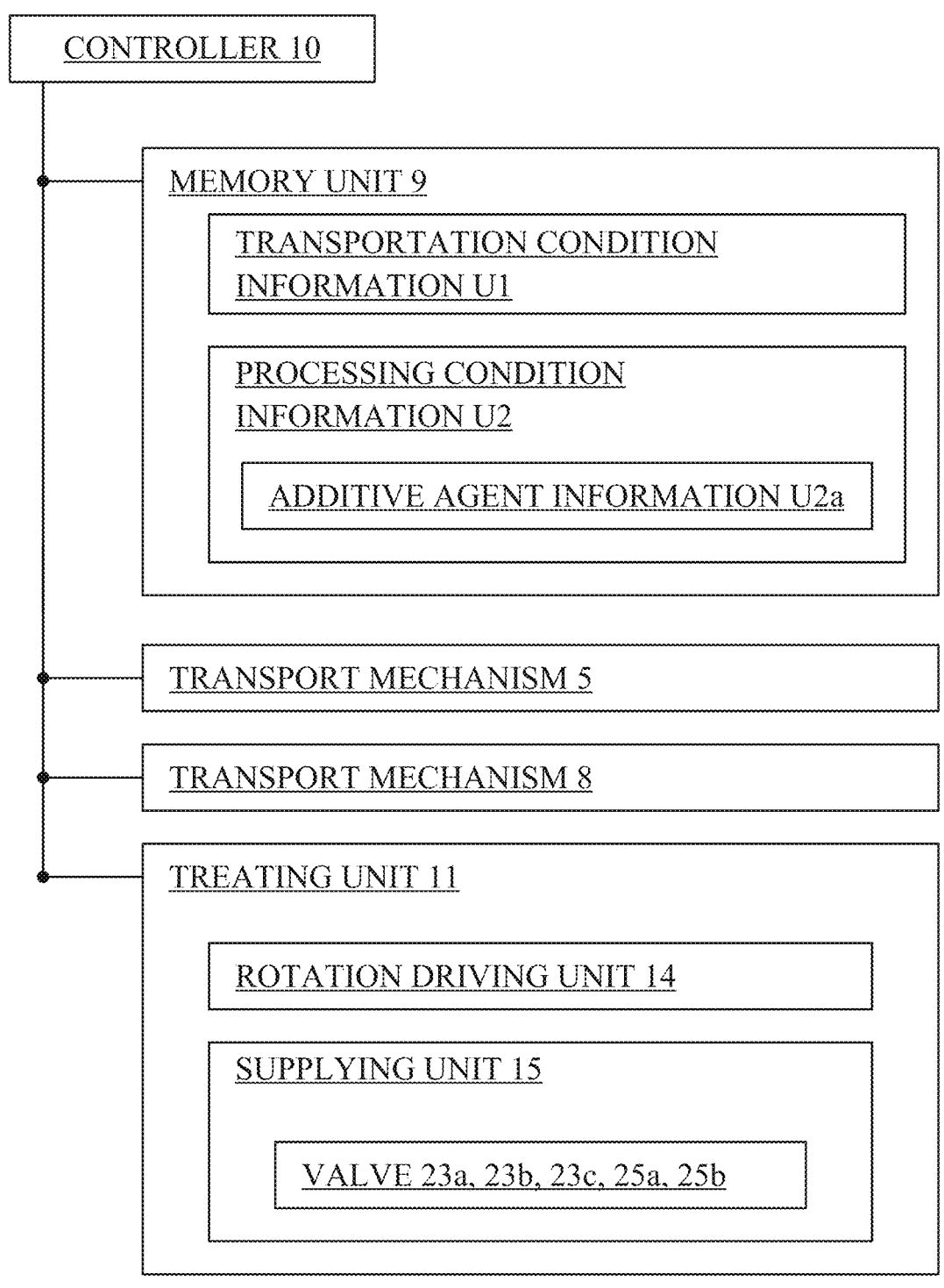
FIG. 2 is a control block diagram of the substrate treating apparatus.

FIG. 2 is a control block diagram of the substrate treating apparatus 1. The substrate treating apparatus 1 includes a memory unit 9. The memory unit 9 stores various kinds of information. The memory unit 9 is implemented by a storage medium such as a fixed disk.

The information stored in the memory unit 9 includes transportation condition information U1 for controlling the transport mechanisms 5, 8, for example. The information stored in the memory unit 9 includes processing condition information U2 for controlling the treating units 11, for example. The transportation condition information U1 and the processing condition information U2 are set in advance. The transportation condition information U1 and the pro-cessing condition information U2 are set before the substrate treating apparatus 1 performs treatment to the substrate W. The processing condition information U2 specifies a condi-tion for performing treatment to the substrate W. The pro-cessing condition information U2 is also called processing recipes. The processing condition information U2 is set, for example, for each substrate W. The processing condition information U2 is set, for example, for each lot of the substrates W.

The substrate treating apparatus 1 includes a controller 10. The controller 10 can communicate with the memory unit 9. The controller 10 refers the transportation condition information U1 and the processing condition information U2. The controller 10 can also communicate with the transport mechanisms 5, 8, and the treating units 11. The controller 10 controls the transport mechanisms 5, 8 and the treating units 11. The controller 10 is implemented by a central processing unit (CPU) and the like that performs various processes.

The following simply describes one example of operation of the substrate treating apparatus 1.

The indexer 3 supplies substrates W to the treating block 7. Specifically, the transport mechanism 5 delivers the substrates W from the carrier C to the transport mechanism 8 of the treating block 7.

The transport mechanism 8 distributes the substrates W to the treating units 11. Specifically, the transport mechanism 8 transports the substrates W from the transport mechanism 5 to the substrate holders 13 of each of the treating units 11.

The treating unit 11 performs treatment on a substrate W held by the substrate holder 13. The treating unit 11 performs etching treatment, for example, on the substrate W. The treating unit 11 performs wet etching treatment, for example, on the substrate W.

After the treating unit 11 performs treatment on the substrate W, the transport mechanism 8 collects the sub-strates W from each of the treating units 11. Specifically, the transport mechanism 8 receives the substrate W from each of the substrate holders 13. Then, the transport mechanism 8 delivers the substrate W to the transport mechanism 5.

The indexer 3 collects the substrates W from the treating block 7. Specifically, the transport mechanism 5 transports the substrates W from the transport mechanism 8 to the carrier C.

<2. Construction of Treating Unit 11>

Figure 3:
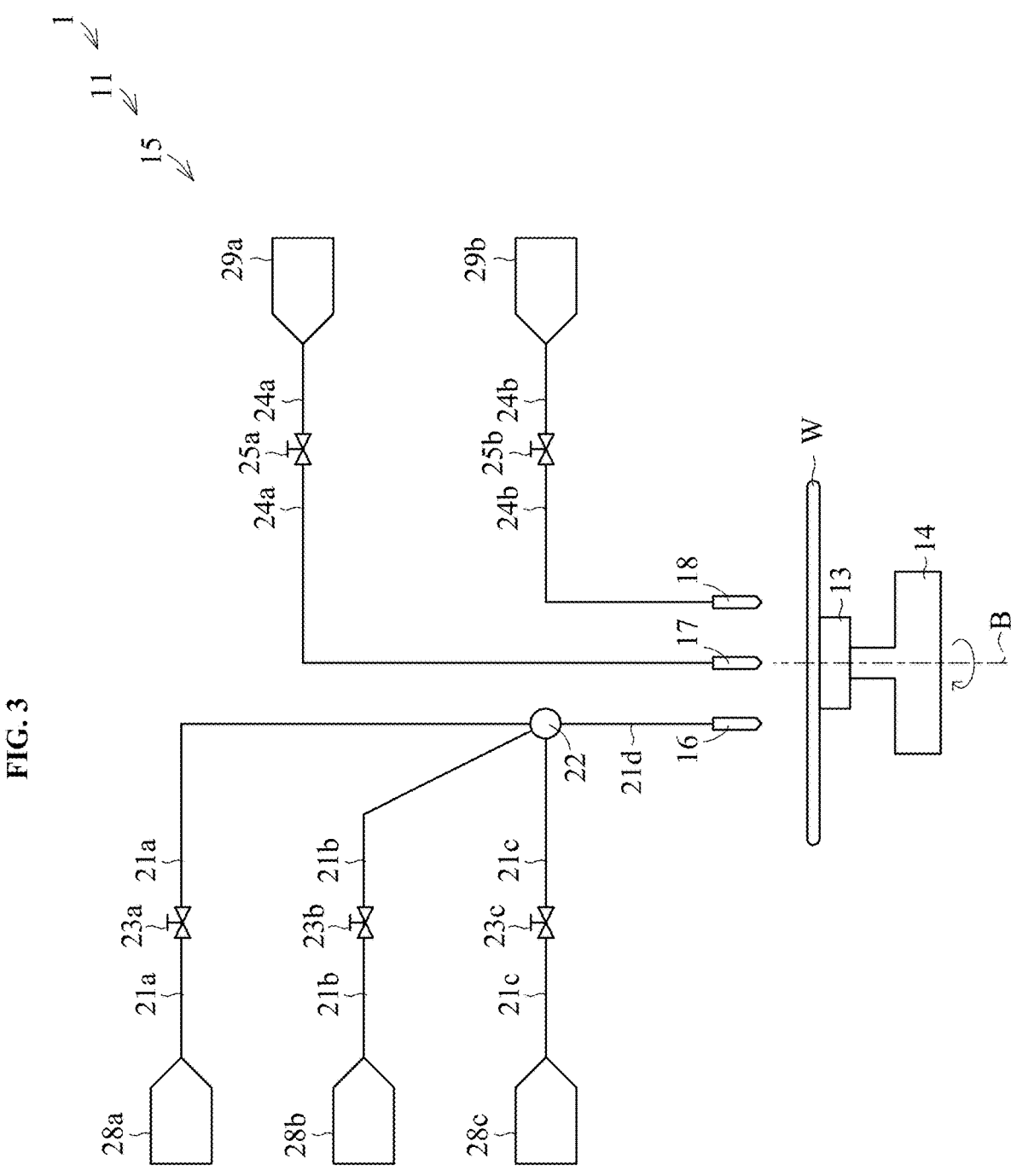
FIG. 3 shows a construction of a treating unit.

FIG. 3 shows the construction of the treating unit 11. The treating units 11 each have the same construction. The treating unit 11 is classified as a single-wafer processing unit. That is, the treating units 11 each perform treatment on only one substrate W at one time.

The substrate holder 13 holds one substrate W. The substrate holder 13 holds the substrate W in a horizontal posture. The substrate holder 13 is located below the sub-strate W that the substrate holder 13 holds. The substrate holder 13 contacts at least either a lower surface of the substrate W or a peripheral edge of the substrate W. The lower surface of the substrate W is also called a back side of the substrate W. The substrate holder 13 does not contact an upper surface of the substrate W.

The treating units 11 each include a rotation driving unit 14. The rotation driving unit 14 is connected to the substrate holder 13. The rotation driving unit 14 rotates the substrate holder 13. The substrate W held by the substrate holder 13 rotates integrally with the substrate holder 13. The substrate W held by the substrate holder 13 rotates around a rotation axis B. The rotation axis B passes through the center of the substrate W and extends in the vertical direction Z, for example.

The treating units 11 each include a supplying unit 15. The supplying unit 15 supplies an etching solution and an additive agent to the substrate W to be held by the substrate holder 13. The supplying unit 15 also supplies a rinse liquid and gas to the substrate W held by the substrate holder 13. For example, the supplying unit 15 supplies the etching solution, the additive agent, the rinse liquid, and gas to the upper surface of the substrate W.

The etching solution supplied from the supplying unit 15 is a hydrogen peroxide solution, for example. Alternatively, the etching solution is, for example, hydrofluoric acid (HF) or buffered hydrofluoric acid (BHF).

The additive agent supplied from the supplying unit 15 is an ionic surfactant. The ionic surfactant includes an anion surfactant and a cation surfactant. The anion surfactant is, for example, sodium dodecyl sulfate (SDS). The cation surfactant is, for example, hexadecyltrimethylammonium chloride (CTAC).

The rinse liquid supplied from the supplying unit 15 is, for example, deionized water (DIW).

The gas supplied from the supplying unit 15 is, for example, dried air or inert gas. The inert gas is, for example, nitrogen gas.

The supplying unit 15 includes a nozzle 16. The nozzle 16 is connected to supplying sources 28*a*, 28*b*, and 28*c*. The nozzle 16 is in fluid communication with the supplying sources 28*a*, 28*b*, and 28*c*. The supplying source 28*a* feeds the etching solution to the nozzle 16. The supplying source 28*b* feeds the anion surfactant to the nozzle 16. The supplying source 28*c* feeds the cation surfactant to the nozzle 16.

One example of a flow path between the nozzle 16 and the supplying sources 28*a* to 28*c* is to be described. The supplying unit 15 includes pipes 21*a*, 21*b*, 21*c* and 21*d*, a cross connector 22, and vales 23*a*, 23*b*, and 23*c*. The supplying source 28*a* is coupled to the cross connector 22 via the pipe 21*a*. The supplying source 28*b* is coupled to the cross connector 22 via the pipe 21*b*. The supplying source 28*c* is coupled to the cross connector 22 via the pipe 21*c*. The nozzle 16 is coupled to the cross connector 22 via the pipe 21*d*. The valve 23*a* is provided on the pipe 21*a*. The valve 23*b* is provided on the pipe 21*b*. The valve 23*c* is provided on the pipe 21*c*. The valve 23*a* controls dispensing of the etching solution from the nozzle 16. Specifically, when the valve 23*a* opens, the etching solution flows from the supplying source 28*a* to the nozzle 16. When the valve 23*a* opens, the nozzle 16 dispenses the etching solution. When the valve 23*a* closes, the etching solution does not flow from the supplying source 28*a* to the nozzle 16. When the valve 23*a* closes, the nozzle 16 does not dispense the etching solution. Likewise, the valve 23*b* controls dispensing of the anion surfactant from the nozzle 16. The valve 23*c* controls dispensing of the cation surfactant from the nozzle 16. When the valves 23*a* and 23*b* open at the same time, the etching solution and the cation surfactant are mixed in the cross connector 22. When the valves 23*a* and 23*b* open at the same time, the nozzle 16 dispenses a mixed liquid of the etching solution and the anion surfactant. Likewise, when the valves 23*a* and 23*c* open at the same time, the nozzle 16 dispenses a mixed liquid of the etching solution and the cation surfactant.

The supplying unit 15 includes a nozzle 17. The nozzle 17 is connected in fluid communication with a supplying source 29*a*. The supplying source 29*a* feeds the rinse liquid to the nozzle 17. The supplying unit 15 includes a pipe 24*a* and a valve 25*a*. The supplying source 29*a* is coupled to the nozzle 17 via the pipe 24*a*. The valve 25*a* is provided on the pipe 24*a*. The valve 25*a* controls dispensing of the rinse liquid from the nozzle 17.

The supplying unit 15 includes a nozzle 18. The nozzle 18 is connected in fluid communication with a supplying source 29*b*. The supplying source 29*b* feeds gas to the nozzle 18. The supplying source 29*b* feeds inert gas to the nozzle 18, for example. The supplying unit 15 includes a pipe 24*b* and a valve 25*b*. The supplying source 29*b* is coupled to the nozzle 18 via the pipe 24*b*. The valve 25*b* is provided on the pipe 24*b*. The valve 25*b* controls dispensing of gas from the nozzle 18.

The treating units 11 each may further have a casing, not shown. The casing accommodates therein the substrate holder 13 and the nozzles 16 to 18. The substrates W are treated within the casing.

The treating units 11 each may further have a cup. The cup is arranged around the substrate holder 13. The cup receives liquid scattered from the substrate W held by the substrate holder 13.

Reference is made to FIG. 2. The controller 10 controls the rotation driving unit 14. The controller 10 controls the supplying unit 15. Specifically, the controller 10 controls the valves 23*a* to 23*c*, and 25*a* to 25*b*.

The processing condition information U2 that the controller 10 contains includes additive agent information U2*a*. The additive agent information U2*a* specifies either the anion surfactant or the cation surfactant as the additive agent.

<3. Substrate W>

The following describes a substrate W. For example, the substrate W has at least either the blanket portion or the recess. When the substrate holder 13 holds the substrate W, at least either the blanket portion or the recess is positioned on the upper surface of the substrate W.

FIG. 4(*a*) and FIG. 4(*b*) each schematically show the blanket portion. A blanket portion P1 is part of the substrate W.

FIG. 4(*a*) illustrates the blanket portion P1 before etching. FIG. 4(*b*) illustrates the blanket portion P1 after etching. The blanket portion P1 is etched in a depth direction d1. An amount of etching the blanket portion P1 corresponds to a distance D1 shown in FIG. 4(*b*), for example. The blanket portion P1 has a face Q1. The face Q1 is exposed to the etching solution. The face Q1 is orthogonal relative to depth direction d1, for example. The face Q1 is planar, for example. The face Q1 is large enough not to generate loss of etching rate of the blanket portion P1. The etching rate is an etching amount per a unit time. FIG. 4(*a*) and FIG. 4(*b*) illustrate lengths M1 and N1 of the face Q1. The lengths M1 and N1 are each larger than 500 nm.

FIG. (*a*) and FIG. 5(*b*) each schematically show a recess. A recess A is a space. The substrate W includes a wall R. The wall R defines the recess A. For example, the wall R includes a first wall R1 and a second wall R2. The second wall R2 faces the first wall R1. The substrate W includes an intermediate part P2. The intermediate part P2 is positioned between the first wall R1 and the second wall R2. The first wall R1 and the second wall R2, and the intermediate part P2 are laminated one another. The wall R and the intermediate part P2 are part of the substrate W.

FIG. 5(a) illustrates the recess A before etching. FIG. 5(b) illustrates the recess A after etching. The intermediate part P2 is etched in a depth direction d2. An amount of etching the intermediate part P2 corresponds to a distance D2 shown in FIG. 5(b), for example. The wall R is not etched. The intermediate part P2 is etched while the first wall R1 and the second wall R2 are not etched, whereby the recess A is formed between the first wall R1 and the second wall R2.

The intermediate part P2 has a face Q2. The face Q2 is exposed to the etching solution. The face Q2 is orthogonal relative to the depth direction d2, for example. The face Q2 is sufficiently small. Accordingly, the recess A is also sufficiently small. The face Q2 is sufficiently narrow. The face Q2 is narrow enough to generate loss of etching rate of the intermediate part P2. Accordingly, the recess A is also narrow enough. The face Q2 is sufficiently smaller than the face Q1. Consequently, the etching rate of the intermediate part P2 is likely to be lower than the etching rate of the blanket portion P1.

FIG. 5(a) and FIG. 5(b) illustrate lengths M2 and N2 of the face Q2, respectively. The length M2 corresponds to a separation distance between the first wall R1 and the second wall R2. The length M2 is equal to or less than 100 nm. The length N2 may be equal to or less than 100 nm, or more than 100 nm.

In this specification, etching of the intermediate part P2 is called etching inside of the recess A, where appropriate. The etching rate of the intermediate part P2 is called an etching rate in the recess A, where appropriate. The length M2 is called a width M2 of the recess A, where appropriate.

<4. Operation Example of Treating Unit 11>

Figure 6:
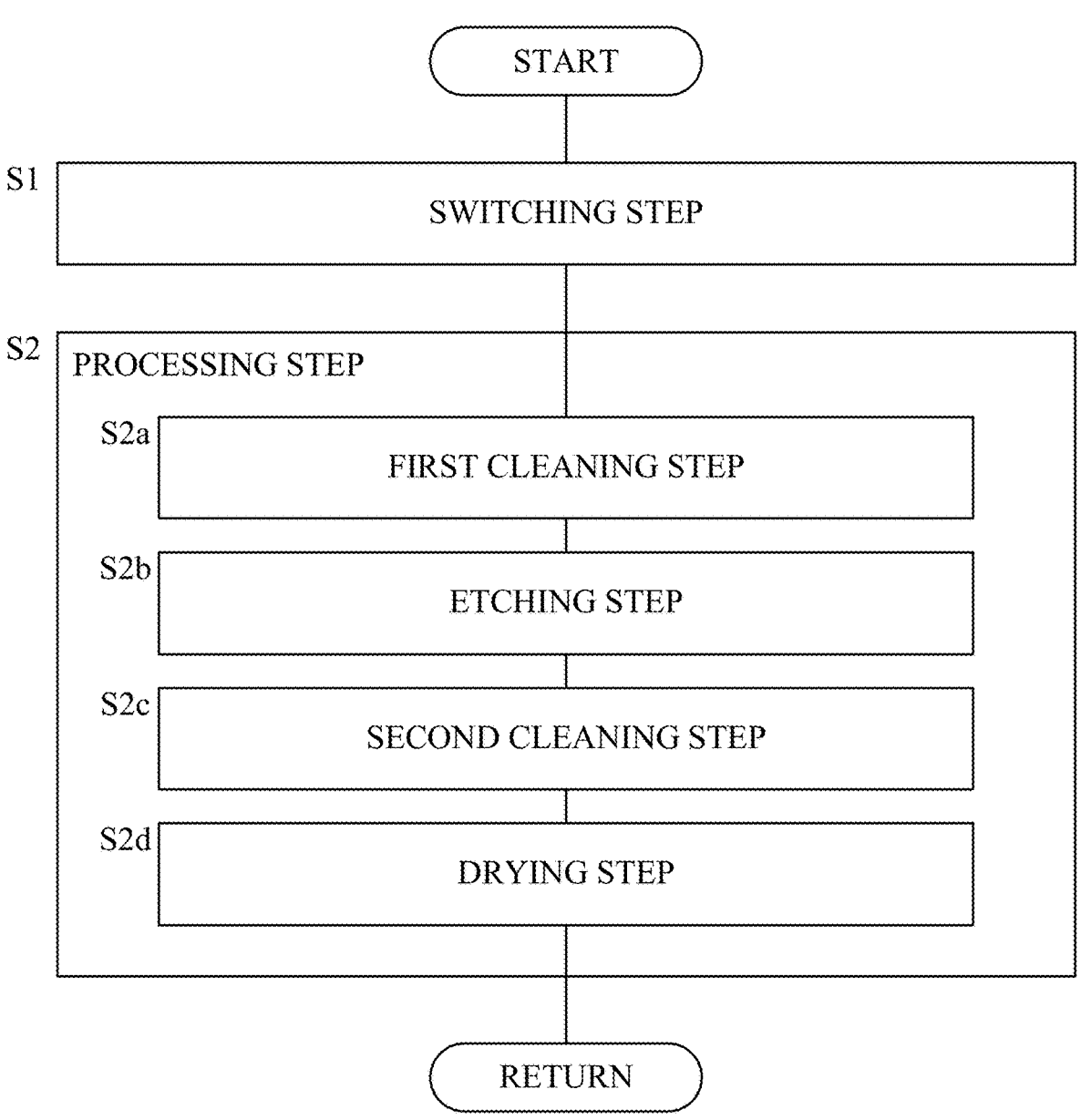
FIG. 6 is a flow chart showing procedures of a substrate treating method.

FIG. 6 is a flow chart showing procedures of a substrate treating method. The substrate treating method includes a switching step and a processing step. The processing step is performed after the switching step. The processing step includes a first cleaning step, an etching step, a second cleaning step, and a drying step. In the processing step, elements of the treating unit 11 each operate in accordance with control by the controller 10.

Step S1: Switching Step

The additive agent is switched between the anion surfactant and the cation surfactant.

Specifically, the controller 10 causes switching of the additive agent between the anion surfactant and the cation surfactant. The controller 10 selects either the anion surfactant or the cation surfactant as the additive agent in accordance with the processing condition information U2. The controller 10 causes switching of the additive agent between the anion surfactant and the cation surfactant in accordance with the additive agent information U2a. The controller 10 selects either the anion surfactant or the cation surfactant, specified from the additive agent information U2a, as the additive agent.

Step S2: Processing Step

The first cleaning step, the etching step, the second cleaning step, and the drying step are performed in this order.

Step S2a: First Cleaning Step

The rinse liquid is supplied to the substrate W. This cleans the substrate W.

Specifically, the valve 25a opens. The nozzle 17 dispenses the rinse liquid to the substrate W held by the substrate holder 13. The rinse liquid cleans the substrate W. Then, the valve 25a closes. The nozzle 17 stops dispensing the rinse liquid.

Step S2b: Etching Step

The additive agent selected in the switching step and the etching solution are supplied to the substrate W. The additive agent and the etching solution are supplied to the substrate W at the same time. This etches the substrate W.

When the anion surfactant is selected as the additive agent in the switching step, the valve 23a opens, the valve 23b opens, and the valve 23c closes. When the anion surfactant is selected as the additive agent, the nozzle 16 dispenses the etching solution and the anion surfactant to the substrate W. Specifically, the nozzle 16 dispenses a mixed liquid of the etching solution and the anion surfactant to the substrate W. The nozzle 16 does not dispense the cation surfactant to the substrate W. Then, the valves 23a and 23b close. The nozzle 16 stops dispensing the mixed liquid.

When the cation surfactant is selected as the additive agent in the switching step, the valve 23a opens, the valve 23b closes, and the valve 23c opens. When the cation surfactant is selected as the additive agent, the nozzle 16 dispenses the etching solution and the cation surfactant to the substrate W. Specifically, the nozzle 16 dispenses a mixed liquid of the etching solution and the cation surfactant to the substrate W. The nozzle 16 does not dispense the anion surfactant to the substrate W. Then, the valves 23a and 23c close. The nozzle 16 stops dispensing the mixed liquid.

Step S2c: Second Cleaning Step

The rinse liquid is supplied to the substrate W. This cleans the substrate W. Operation in the step 2c is same as operation in the step S2a, for example.

Step S2d: Drying Step

Gas is supplied to the substrate W. This dries the substrate W.

Specifically, the valve 25b opens. The nozzle 18 dispenses gas to the substrate W held by the substrate holder 13. The gas dries the substrate W. Then, the valve 25b closes. The nozzle 18 stops dispensing gas.

The rotation driving unit 14 may rotate the substrate W in at least part of the processing step described above. For example, the rotation driving unit 14 may rotate the substrate W in all parts of the processing step described above.

<5. Technical Meanings of Switching Step>

The following describes technical meanings of the switching step from a comparative example and experimental examples 1 to 6. FIG. 7 is a table of the comparative example and the experimental examples 1 to 6. FIG. 7 illustrates a table of an etching rate and a blanket ratio of the substrate W when the substrate W is treated in the comparative example and the experimental examples 1 to 6.

The comparative example and the experimental examples 1 to 6 are each performed under conditions as below. In the comparative example and the experimental examples 1 to 6, the substrate W is treated in the processing step described above. The conditions of the first cleaning step, the second cleaning step, and the drying step are the same between the comparative example and the experimental examples 1 to 6. The etching step differs in the condition between the comparative example and the experimental examples 1 to 6.

Specifically, the comparative example is same as the experimental examples 1 to 6 in the etching solution supplied to the substrate W in the etching step. A composition of the etching solution supplied to the substrate W in the etching step is common between the comparative example and the experimental examples 1 to 6. The etching solution is a hydrogen peroxide solution. In other words, the hydrogen peroxide solution is an aqueous solution made by diluting hydrogen peroxide with deionized water (DIW). The etching solution is acid.

The additive agent supplied to the substrate W in the etching step is different between the comparative example and the experimental examples 1 to 6. In the etching step of the comparative example, the additive agent is not supplied to the substrate W. In the etching step of the experimental examples 1 to 6, the additive agent is supplied to the substrate W.

The additive agent in the experimental examples 1 to 3 is sodium dodecyl sulfate. Hereunder, the sodium dodecyl sulfate is abbreviated to SDS. SDS belongs to the anion surfactant. In the experimental example 1, a concentration of SDS to the etching solution is 1 mM. Here, M means mol/L. That is, in the experimental example 1, an amount of SDS per liter of the etching solution is 0.001 mol. In the experimental example 2, a concentration of SDS to the etching solution is 10 mM. In the experimental example 3, a concentration of SDS to the etching solution is 100 mM.

The additive agent in the experimental examples 4 to 6 is hexadecyltrimethylammonium chloride. Hereunder, hexadecyltrimethylammonium chloride is abbreviated to CTAC. CTAC belongs to the cation surfactant. In the experimental example 4, a concentration of CTAC to the etching solution is 1 mM. In the experimental example 5, a concentration of CTAC to the etching solution is 10 mM. In the experimental example 6, a concentration of CTAC to the etching solution is 100 mM.

In the comparative example and the experimental examples 1 to 6, the blanket portion P1 is etched. The blanket portion P1 is made of titanium nitride. After the comparative example and the experimental examples 1 to 6 are performed, an etching rate EB of the blanket portion P1 is measured. With reference to FIG. 4(b), the etching rate EB corresponds to the distance D1 per one minute.

Moreover, in the comparative example and the experimental examples 1 to 6, recesses A1, A2, and A3 are etched. Here with reference to FIG. 5(b), a width M2 of the recess A1 is 2 nm. A width M2 of the recess A2 is 5 nm. A width M2 of the recess A3 is 10 nm. The recess A1 is formed by the first wall R1, the second wall R2, and the intermediate part P2. The first wall R1 is made of silicon dioxide (SiO$_2$). The second wall R2 is made of polysilicon. The intermediate part P2 is made of titanium nitride. Likewise, the recesses A2 and A3 are each formed by the first wall R1, the second wall R2, and the intermediate part P2. The first wall R1 of each of the recesses A2 and A3 is made of silicon dioxide (SiO$_2$). The second wall R2 of each of the recesses A2 and A3 is made of polysilicon. The intermediate part P2 of each of the recesses A2 and A3 is made of titanium nitride. After the comparative example and the experimental examples 1 to 6 are performed, an etching rate EA1 in the recess A1 is measured. Likewise, after the comparative example and the experimental examples 1 to 6 are performed, etching rates EA2 and EA3 in the recesses A2 and A3, respectively, are measured. With reference to FIG. 5(b), the etching rates EA1, EA2, and EA3 each correspond to a distance D2 per one minute.

Furthermore, blanket ratios F1, F2, and F3 are calculated based on the etching rates EB, EA1, EA2, and EA3. The blanket ratio F1 is a ratio of the etching rate EA1 relative to the etching rate EB. The blanket ratio F2 is a ratio of the etching rate EA2 relative to the etching rate EB. The blanket ratio F3 is a ratio of the etching rate EA3 relative to the etching rate EB. In other words, the blanket ratios F1, F2, and F3 are defined by the following expressions.

$$F1 = EA1 / EB$$

$$F2 = EA2 / EB$$

$$F3 = EA3 / EB$$

Hereunder, the etching rates EA1, EA2, and EA3 are called an etching rate EA when the etching rates EA1, EA2, and EA3 are not distinguished. The blanket ratios F1, F2, and F3 are called a blanket ratio F when the blanket ratios F1, F2, and F3 are not distinguished.

Reference is made to the comparative example in FIG. 7. In the comparative example, the etching rate EB is 7.7 nm/min. In the comparative example, the etching rates EA1, EA2, and EA3 are 2.20 nm/min, 5.56 nm/min, and 6.73 nm/min, respectively. In the comparative example, the etching rate EB is higher than the etching rates EA1, EA2, and EA3. In the comparative example, the etching rate EA of the recess A decreases as the width M2 of the recess A is reduced.

In the comparative example, the blanket ratios F1, F2, and F3 are each less than 1. In the comparative example, the blanket ratio F decreases as the width M2 of the recess A is reduced.

In order to distinguish the blanket ratio F1 in the comparative example from the blanket ratio F1 in the experimental examples 1 to 6, the blanket ratio F1 in the comparative example is called a reference value FIT. Likewise, the blanket ratios F2 and F3 in the comparative example are called reference values F2T and F3T, respectively. When no distinction is made among the reference values FIT, F2T, and F3T, the reference values FIT, F2T, and F3T are called a reference value FT.

Reference is made to experimental examples 1 to 3. In the experimental examples 1 to 3, the etching rate EB falls within a range of 0.9 nm/min to 1.6 nm/min. As above, the etching rate EB in each of the experimental examples 1 to 3 is significantly lower than the etching rate EB in the comparative example. The etching rate EB in each of the experimental examples 1 to 3 is close to zero. In the experimental examples 1 to 3, the blanket portion P1 is protected from etching. In the experimental examples 1 to 3, etching of the blanket portion P1 is prevented.

In the experimental examples 1 to 3, the etching rate EA1 falls within a range of 1.40 nm/min to 2.40 nm/min. As above, the etching rate EA1 in each of the experimental examples 1 to 3 is equal to or slightly lower than the etching rate EA1 in the comparative example. The etching rate EA2 in each of the experimental examples 1 to 3 is slightly lower than the etching rate EA2 in the comparative example. The etching rate EA3 in each of the experimental examples 1 to 3 is slightly lower than the etching rate EA3 in the comparative example. In the experimental examples 1 to 3, the recess A is etched suitably. In the experimental examples 1 to 3, etching of the recess A is permitted.

The etching rate EB in the experimental example 1 is lower than the etching rates EA1, EA2, and EA3 in the experimental example 1. Likewise, the etching rate EB is lower than the etching rates EA1, EA2, and EA3 in the experimental example 2. The etching rate EB is lower than the etching rates EA1, EA2, and EA3 in the experimental example 3. In summary, the etching rate EB is lower than the etching rate EA in the experimental examples 1 to 3.

The blanket ratio F1 in each of the experimental examples 1 to 3 is higher than the reference value FIT. Likewise, the blanket ratio F2 in each of the experimental examples 1 to 3 is higher than the reference value F2T. The blanket ratio F3 in each of the experimental examples 1 to 3 is higher than the reference value F3T. In summary, the blanket ratio F in each of the experimental examples 1 to 3 is higher than the reference value FT.

The blanket ratio F1 in each of the experimental examples 1 to 3 is higher than 1. Likewise, the blanket ratio F2 in each of the experimental examples 1 to 3 is higher than 1. The blanket ratio F3 in each of the experimental examples 1 to 3 is higher than 1. In summary, the blanket ratio F is higher than 1 in each of the experimental examples 1 to 3.

Reference is made to experimental examples 4 to 6. In the experimental examples 4 to 6, the etching rate EB falls within a range of 2.8 nm/min to 4.5 nm/min. As above, the etching rate EB in each of the experimental examples 4 to 6 is slightly lower than the etching rate EB in the comparative example. The etching rate EB in each of the experimental examples 4 to 6 is higher than the etching rate EB in the experimental examples 1 to 3. In the experimental examples 4 to 6, the blanket portion P1 is etched suitably. In the experimental examples 4 to 6, etching of the blanket portion P1 is permitted.

In the experimental examples 4 to 6, the etching rate EA1 falls within a range of 0.63 nm/min to 0.89 nm/min. As above, the etching rate EA1 in each of the experimental examples 4 to 6 is significantly lower than the etching rate EA1 in the comparative example. Likewise, the etching rate EA2 in each of the experimental examples 4 to 6 is significantly lower than the etching rate EA2 in the comparative example. The etching rate EA3 in each of the experimental examples 4 to 6 is significantly lower than the etching rate EA3 in the comparative example. Moreover, the etching rate EA1 in each of the experimental examples 4 to 6 is lower than the etching rate EA1 in the experimental examples 1 to 3. The etching rate EA2 in each of the experimental examples 4 to 6 is lower than the etching rate EA2 in the experimental examples 1 to 3. The etching rate EA3 in each of the experimental examples 4 to 6 is lower than the etching rate EA3 in the experimental examples 1 to 3. The etching rate EA in each of the experimental examples 4 to 6 is close to zero. In the experimental examples 4 to 6, the recess A is protected from etching. In the experimental examples 4 to 6, etching of the recess A is avoided.

The etching rate EB in the experimental example 4 is higher than the etching rates EA1, EA2, and EA3 in the experimental example 4. Likewise, the etching rate EB is higher than the etching rates EA1, EA2, and EA3 in the experimental example 5. The etching rate EB is higher than the etching rates EA1, EA2, and EA3 in the experimental example 6. In summary, the etching rate EB is higher than the etching rate EA in the experimental examples 4 to 6.

The blanket ratio F1 in each of the experimental examples 4 to 6 is lower than the reference value FIT. Likewise, the blanket ratio F2 in each of the experimental examples 4 to 6 is lower than the reference value F2T. The blanket ratio F3 in each of the experimental examples 4 to 6 is lower than the reference value F3T. In summary, the blanket ratio F in each of the experimental examples 4 to 6 is lower than the reference value FT.

The blanket ratios F1, F2, F3 in each of the experimental examples 4 to 6 are lower than 1. The blanket ratios F1, F2, F3 in each of the experimental examples 4 to 6 are close to zero. In summary, the blanket ratio F in each of the experimental examples 4 to 6 is lower than 1. The blanket ratio F in the experimental examples 4 to 6 is close to zero.

<6. Role of Additive Agent in Etching>

The Inventor presumes a role of the additive agent in the etching step as under.

Figure 8:
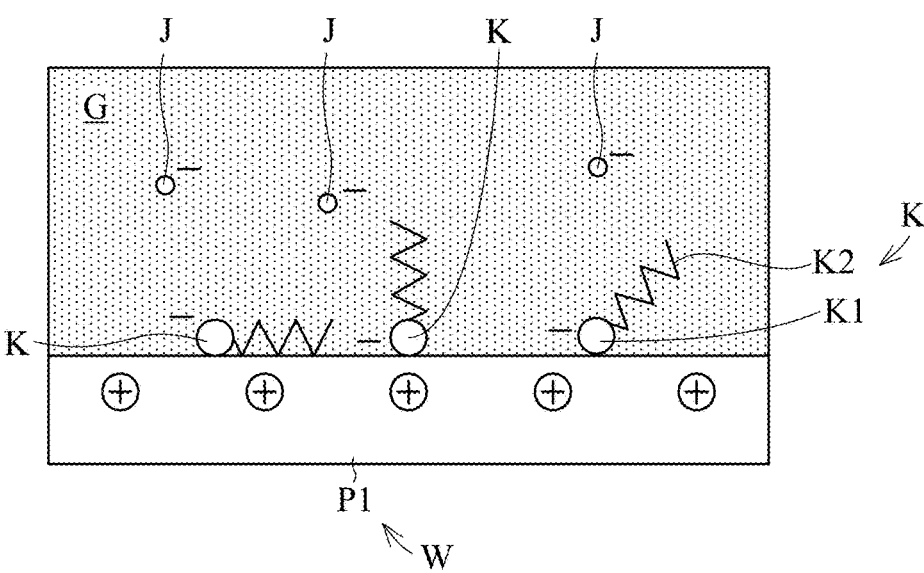
FIG. 8 schematically shows a blanket portion to which an anion surfactant and an etching solution are supplied.

FIG. 8 schematically shows the blanket portion P1 to which the anion surfactant and the etching solution are supplied.

A mixed liquid G contains the etching solution. The etching solution includes an etching species J. The etching species J etches the blanket portion P1. The etching species J is negatively charged, for example. The etching species J is, for example, a negative ion. When the etching solution is a hydrogen peroxide solution, the etching species J is $HO_2^-$. The etching solution is acid, for example. Accordingly, the mixed liquid G is acid, for example.

The mixed liquid G contains an anion surfactant K. The anion surfactant K is negatively charged in the mixed liquid G. The anion surfactant K is ionized to a negative ion in the mixed liquid G. Specifically, the anion surfactant K has a hydrophilic group K1 and a hydrophobic group K2. The hydrophilic group K1 is negatively charged in the mixed liquid G.

The blanket portion P1 is exposed to the mixed liquid G. When the etching solution is supplied to the substrate W, the blanket portion P1 is positively charged, for example. When the mixed liquid G is acid, it is easy to make the blanket portion P1 positively charged.

The anion surfactant K has polarity opposite to that of the blanket portion P1. Accordingly, the anion surfactant K is attracted to the blanket portion P1. The anion surfactant K is easy to approach the blanket portion P1. The anion surfactant K is easy to concentrate in the vicinity of the blanket portion P1. The anion surfactant K is easy to adhere to the blanket portion P1. The anion surfactant K is easy to cover the blanket portion P1. Consequently, the anion surfactant K avoids approaching of the etching species J to the blanket portion P1. The anion surfactant K avoids concentration of the etching species J in the vicinity of the blanket portion P1. The anion surfactant K avoids contact of the etching species J to the blanket portion P1. The anion surfactant K avoids etching of the blanket portion P1 with the etching species J. As above, the anion surfactant K protects the blanket portion P1 from the etching species J. The anion surfactant K protects the blanket portion P1 from the etching. The anion surfactant K avoids etching of the blanket portion P1. As a result, the etching rate EB of the blanket portion P1 decreases significantly.

Note that the etching species J also has polarity opposite to that of the blanket portion P1. Accordingly, the etching species J is also attracted to the blanket portion P1. Here, the anion surfactant K has the hydrophilic group K1 and the hydrophobic group K2. When the blanket portion P1 is hydrophobic, affinity between the hydrophobic group K2 and the blanket portion P1 is higher than affinity between the etching species J and the blanket portion P1. When the blanket portion P1 is hydrophilic, affinity between the hydrophilic group K1 and the blanket portion P1 is higher than affinity between the etching species J and the blanket portion P1. As above, even both when the blanket portion P1 is hydrophobic and when the blanket portion P1 is hydrophilic, the affinity between the anion surfactant K and the blanket portion P1 is higher than the affinity between the etching species J and the blanket portion P1. Consequently, the etching species J approaches the blanket portion P1 more easily than the anion surfactant K approaches the blanket portion P1.

Moreover, the anion surfactant K is larger than the etching species J. Consequently, the anion surfactant K in the vicinity of the blanket portion P1 avoids approaching of the etching species J to the blanket portion P1 effectively.

Figure 9:
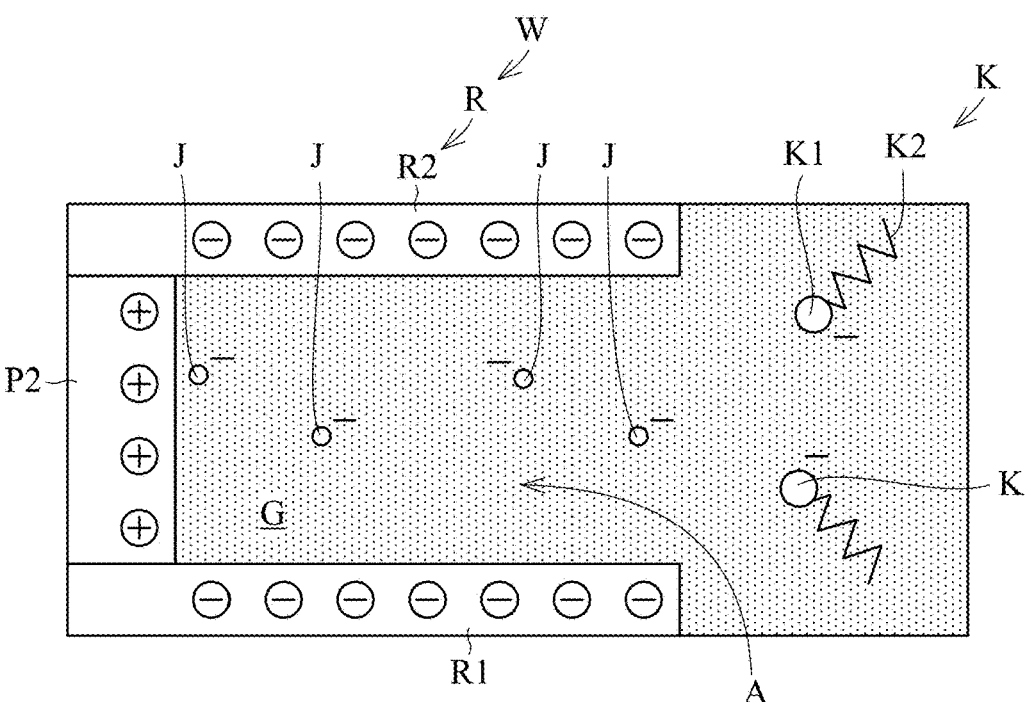
FIG. 9 schematically shows a recess to which an anion surfactant and an etching solution are supplied.

FIG. 9 schematically shows the recess A to which the anion surfactant and the etching solution are supplied.

The recess A is exposed to the mixed liquid G. When the etching solution is supplied to the substrate W, the intermediate part P2 is positively charged, for example. When the etching solution is supplied to the substrate W, the wall R is negatively charged, for example. When the etching solution is supplied to the substrate W, the first wall R1 is negatively charged, for example. When the etching solution is supplied to the substrate W, the second wall R2 is negatively charged, for example.

The anion surfactant K has same polarity as that of the wall R. Accordingly, the anion surfactant K and the wall R repeal. The anion surfactant K is hard to approach the recess A. The anion surfactant K is hard to enter the recess A. The anion surfactant K is hard to concentrate within the recess A. Accordingly, the anion surfactant K does not prevent the etching species J from entering the recess A. In other words, the anion surfactant K allows the etching species J to enter the recess A. The anion surfactant K permits concentration of the etching species J in the recess A. The anion surfactant K permits contact of the etching species J to the intermediate part P2. The anion surfactant K permits etching of the intermediate part P2 with the etching species J. As above, the anion surfactant K does not prevent etching inside of the recess A2. The anion surfactant K permits etching inside of the recess A. Consequently, the recess A is etched suitably. The etching of the recess A is promoted.

Here, the etching species J also has the same polarity as that of the wall R. However, the etching species J is smaller than the anion surfactant K. Accordingly, the etching species J enters the recess A more easily than the anion surfactant K enters the recess A.

Moreover, the anion surfactant K releases an opposite ion, not shown, into the mixed liquid G. Here, the opposite ion of the anion surfactant K is a positive ion. For example, when the anion surfactant K is SDS, the opposite ion is Na⁺. The opposite ion of the anion surfactant K is attracted to the wall R. Then, the opposite ion of the anion surfactant K is neutralized electrically in the vicinity of the wall R. Accordingly, the opposite ion in the vicinity of the wall R reduces a force of repulsion between the etching species J and the wall R. As a result, the etching species J enters the recess A more easily.

Figure 10:
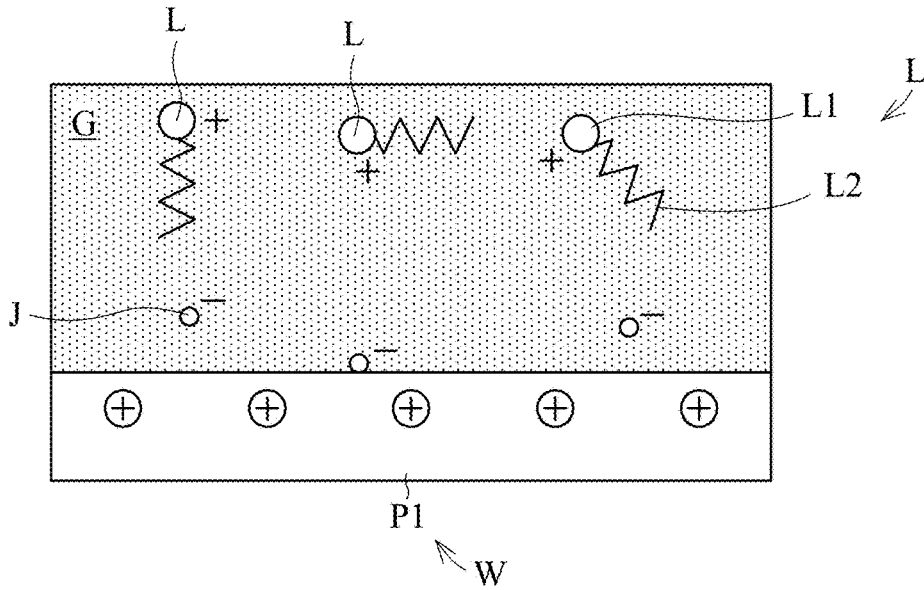
FIG. 10 schematically shows a blanket portion to which a cation surfactant and an etching solution are supplied.

FIG. 10 schematically shows the blanket portion P1 to which the cation surfactant and the etching solution are supplied.

As described above, the mixed liquid G contains the etching solution. The etching solution includes an etching species J. The etching species J is, for example, a negative ion. The etching solution is acid, for example. The mixed liquid G also is acid, for example.

The mixed liquid G contains a cation surfactant L. The cation surfactant L is positively charged in the mixed liquid G. The cation surfactant L is ionized to a positive ion in the mixed liquid G. Specifically, the cation surfactant L has a hydrophilic group L1 and a hydrophobic group L2. The hydrophilic group L1 is positively charged in the mixed liquid G.

The blanket portion P1 is exposed to the mixed liquid G. When the etching solution is supplied to the substrate W, the blanket portion P1 is positively charged, for example.

The cation surfactant L has same polarity as that of the blanket portion P1. Accordingly, the cation surfactant L and the blanket portion P1 repeal. The cation surfactant L is hard to approach the blanket portion P1. The cation surfactant L is hard to concentrate in the vicinity of the blanket portion P1. The cation surfactant L is hard to adhere to the blanket portion P1. The cation surfactant L is hard to cover the blanket portion P1. Consequently, the cation surfactant L does not avoid approaching of the etching species J to the blanket portion P1. That is, the cation surfactant L permits approaching of the etching species J to the blanket portion P1. The cation surfactant L permits concentration of the etching species J in the vicinity of the blanket portion P1. The cation surfactant L permits contact of the etching species J to the blanket portion P1. The cation surfactant L permits etching of the blanket portion P1 with the etching species J. As above, the cation surfactant L permits etching of the blanket portion P1. The cation surfactant L does not avoid etching of the blanket portion P1. As a result, the blanket portion P1 is etched suitably. The etching of the blanket portion P1 is promoted.

Note that the etching species J has polarity opposite to that of the blanket portion P1. Consequently, the etching species J approaches the blanket portion P1 more easily. The etching species J contacts the blanket portion P1 more easily.

The cation surfactant L has the hydrophilic group L1 and the hydrophobic group L2. When the blanket portion P1 is hydrophobic, affinity between the hydrophobic group L2 and the blanket portion P1 is high. When the blanket portion P1 is hydrophilic, affinity between the hydrophilic group L1 and the blanket portion P1 is high. As above, even both when the blanket portion P1 is hydrophobic and when the blanket portion P1 is hydrophilic, the affinity between the cation surfactant L and the blanket portion P1 is high. Accordingly, part of the cation surfactant L may approach the blanket portion P1. Accordingly, part of the cation surfactant L may reduce the etching rate EB of the blanket portion P1 slightly.

Figure 11:
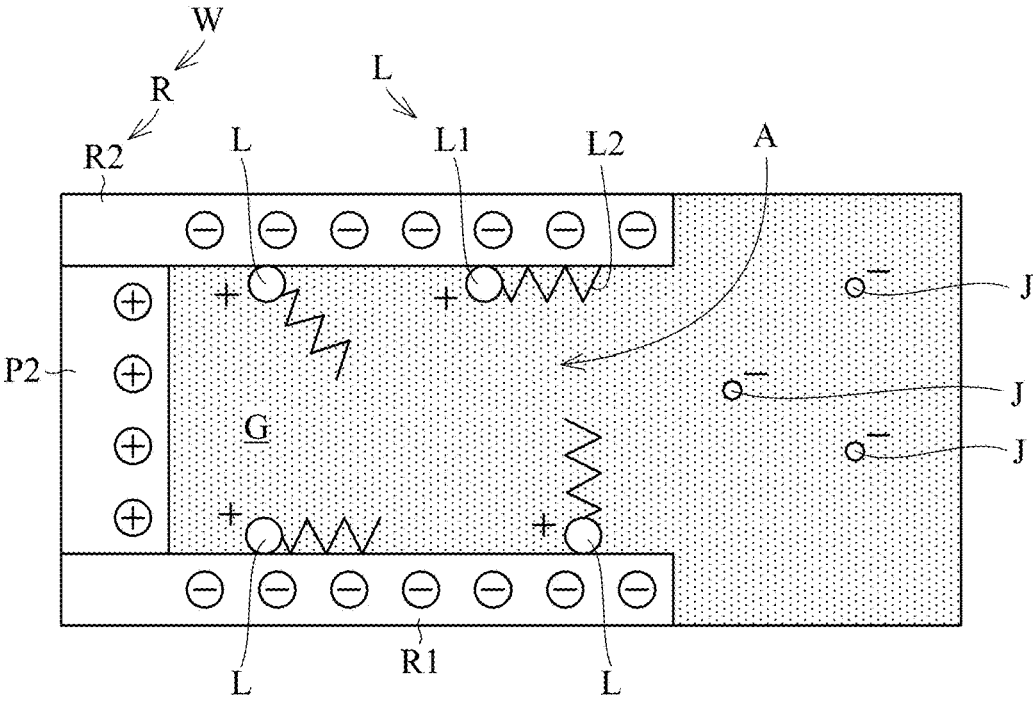
FIG. 11 schematically shows a recess to which a cation surfactant and an etching solution are supplied.

FIG. 11 schematically shows the recess A to which the cation surfactant and the etching solution are supplied.

As described above, the recess A is exposed to the mixed liquid G. When the etching solution is supplied to the substrate W, the intermediate part P2 is positively charged, for example. When the etching solution is supplied to the substrate W, the wall R is negatively charged, for example.

The cation surfactant L has polarity opposite to that of the wall R. Accordingly, the cation surfactant L is attracted to the wall R. The cation surfactant L is easy to approach the recess A. The cation surfactant L is easy to enter the recess A. The cation surfactant L is easy to concentrate within the recess A. Accordingly, the cation surfactant L prevents the etching species J from entering the recess A. The cation surfactant L prevents concentration of the etching species J within the recess A. The cation surfactant L avoids contact of the etching species J to the intermediate part P2. The cation surfactant L avoids etching of the intermediate part P2 with the etching species J. As above, the cation surfactant L protects the recess A from the etching species J. The cation surfactant L protects the recess A from etching. The cation surfactant L avoids etching inside of the recess A. As a result, the etching rate EA in the recess A decreases significantly.

Here, the etching species J has the same polarity as that of the wall R. Accordingly, the etching species J and the wall R repeal each other. As a result, it is more difficult for the etching species J to enter the recess A.

Moreover, the cation surfactant L is larger than the etching species J. Accordingly, the cation surfactant L in the recess A can prevent the etching species J from entering the recess A effectively.

Especially, the recess A is very narrow. Accordingly, the cation surfactant L in the recess A occupies large part of the recess A. Consequently, when the cation surfactant L is in the recess A, the recess A has almost no space for the etching species J. If the cation surfactant L and the etching species J are in the recess A, the etching species J and the cation surfactant L is likely to collide with each other. If the cation surfactant L and the etching species J are in the recess A, the etching species J and the cation surfactant L is likely to generate steric hindrance. Accordingly, the cation surfactant L in the recess A prevents the etching species J from entering the recess A more effectively.

<7. Effect of Embodiment>

The substrate treating method in this embodiment includes the switching step and the processing step. In the switching step, the additive agent is switched between the anion surfactant K and the cation surfactant L. In the switching step, one of the anion surfactant K and the cation surfactant L is selected as the additive agent. In the switching step, the other of the anion surfactant K and the cation surfactant L is not selected as the additive agent. In the processing step, the etching solution is supplied to the substrate W. In the processing step, one of the anion surfactant K and the cation surfactant L is supplied to the substrate W. In the processing step, the other of the anion surfactant K and the cation surfactant L is not supplied to the substrate W. In the processing step, the additive agent supplied to the substrate W is limited to the additive agent selected in the switching step. That is, in the processing step, the additive agent selected in the switching step is supplied to the substrate W. As described above, the additive agent to be supplied to the substrate W in the processing step is switched suitably between the anion surfactant K and the cation surfactant L. As a result, the substrate W is etched suitably in the processing step.

In the switching step, either the anion surfactant K or the cation surfactant L is selected as the additive agent in accordance with the processing condition information U2. Accordingly, the additive agent supplied to the substrate W in the processing step is switched more suitably between the anion surfactant K and the cation surfactant L. Consequently, the substrate W is etched more suitably.

The processing condition information U2 includes additive agent information U2a. The additive agent information U2a specifies either the anion surfactant K or the cation surfactant L as the additive agent. In the switching step, the additive agent is switched between the anion surfactant K and the cation surfactant L in accordance with the additive agent information U2a. Accordingly, the additive agent supplied to the substrate W in the processing step is switched more suitably between the anion surfactant K and the cation surfactant L. Consequently, the substrate W is etched more suitably.

When the etching solution is supplied to the substrate W, the blanket portion P1 is positively charged. Accordingly, when the etching solution and the anion surfactant K are supplied to the substrate W, the anion surfactant K has polarity opposite to that of the blanket portion P1. Accordingly, the blanket portion P1 and the anion surfactant K attract each other. The anion surfactant K concentrates in the vicinity of the blanket portion P1. Consequently, the anion surfactant K prevents etching of the blanket portion P1 with the etching solution. That is, the anion surfactant K satisfactorily avoids etching of the blanket portion P1. When the etching solution and the cation surfactant L are supplied to the substrate W, the cation surfactant L has same polarity as that of the blanket portion P1. Accordingly, the blanket portion P1 and the cation surfactant L repeal each other. The cation surfactant L does not concentrate in the vicinity of the blanket portion P1. Consequently, the cation surfactant L does not prevent etching of the blanket portion P1 with the etching solution. That is, the cation surfactant L satisfactorily permits etching of the blanket portion P1. As described above, switching the additive agent between the anion surfactant K and the cation surfactant L causes suitable control of the etching rate EB of the blanket portion P1.

When the etching solution is supplied to the substrate W, the wall R is negatively charged. When the etching solution and the anion surfactant K are supplied to the substrate W, the anion surfactant K has same polarity as that of the wall R. Accordingly, the wall R and the anion surfactant K repeal each other. It is difficult for the anion surfactant K to enter the recess A. Consequently, the anion surfactant K does not prevent etching inside of the recess A with the etching solution. That is, the anion surfactant K satisfactorily permits etching inside of the recess A. When the etching solution and the cation surfactant L are supplied to the substrate W, the cation surfactant L has polarity opposite to that of the wall R. Accordingly, the wall R and the cation surfactant L attract each other. It is easy for the cation surfactant L to enter the recess A. Consequently, the cation surfactant L prevents etching inside of the recess A with the etching solution. That is, the cation surfactant L satisfactorily avoids etching inside of the recess A. As described above, switching the additive agent between the anion surfactant K and the cation surfactant L causes suitable control of the etching rate EA in the recess A.

The etching solution is acid. When the etching solution is supplied to the substrate W, the blanket portion P1 is positively charged satisfactorily. When the etching solution is supplied to the substrate W, the wall R is negatively charged satisfactorily.

The etching solution is a hydrogen peroxide solution, for example. Accordingly, with the hydrogen peroxide solution, the substrate W is etched suitably.

The blanket portion P1 is made of titanium nitride, for example. For example, when the anion surfactant K and the hydrogen peroxide solution are supplied to the substrate W, the blanket portion P1 and the anion surfactant K attract each other. Accordingly, the anion surfactant K satisfactorily protects the blanket portion P1, made of titanium nitride, from the hydrogen peroxide solution. The anion surfactant K suitably prevents etching of the blanket portion P1, made of titanium nitride, with the hydrogen peroxide solution. For example, when the cation surfactant L and the hydrogen peroxide solution are supplied to the substrate W, the blanket portion P1 and the cation surfactant L repeal each other. Consequently, the cation surfactant L suitably permits etching of the blanket portion P1, made of titanium nitride, with the hydrogen peroxide solution.

The wall R is made of silicon dioxide and polysilicon, for example. The first wall R1 is made of silicon dioxide, for example. The second wall R2 is made of polysilicon, for example. For example, when the anion surfactant K and the hydrogen peroxide solution are supplied to the substrate W, the anion surfactant K permits etching inside of the recess A, made of silicon dioxide and polysilicon, with the hydrogen peroxide solution suitably. For example, when the cation surfactant L and the hydrogen peroxide solution are supplied to the substrate W, the cation surfactant L protects the recess A, made of silicon dioxide and polysilicon, with the hydrogen peroxide solution suitably. When the wall R is made of silicon dioxide and polysilicon, the cation surfactant L prevents etching inside of the recess A with the hydrogen peroxide solution suitably.

The intermediate part P2 is made of titanium nitride, for example. Accordingly, when the anion surfactant K and the hydrogen peroxide solution are supplied to the substrate W, the anion surfactant K permits etching of the intermediate part P2, made of titanium nitride, with the hydrogen peroxide solution suitably. Consequently, the anion surfactant K permits etching inside of the recess A with the hydrogen peroxide solution more suitably.

The substrate treating apparatus 1 includes the substrate holder 13, the supplying unit 15, and the controller 10. The substrate holder 13 holds a substrate W. The supplying unit 15 supplies an etching solution and an additive agent to the substrate W held by the substrate holder 13. The controller 10 controls the supplying unit 15. The controller 10 causes switching of the additive agent between the anion surfactant K and the cation surfactant L. Accordingly, the additive agent supplied to the substrate W is switched suitably between the anion surfactant K and the cation surfactant L. Consequently, the substrate W is etched suitably.

This invention is not limited to the foregoing examples, but may be modified as follows.

(1) In this embodiment, the additive agent is switched between the anion surfactant K and the cation surfactant L in accordance with the additive agent information U2a in the switching step. However, the present invention is not limited to this. The following describes various modifications.

(1-1) The processing condition information U2 specifies an etching condition. The etching condition contains a first etching condition and a second etching condition, for example. The first etching condition is to etch an inside of the recess A while protecting the blanket portion P1 from the etching. The first etching condition is to permit etching inside of the recess A while avoiding etching of the blanket portion P1. The second etching condition is to etch the blanket portion P1 while protecting the recess A from etching. The second etching condition is to permit etching of blanket portion P1 while avoiding etching inside of the recess A. When the processing condition information U2 specifies the first etching condition, one of the anion surfactant K and the cation surfactant L is selected as the additive agent in the switching step. When the processing condition information U2 specifies the second etching condition, the other of the anion surfactant K and the cation surfactant L is selected as the additive agent in the switching step.

In this modification, the additive agent supplied to the substrate W in the processing step is switched more suitably between the anion surfactant K and the cation surfactant L. Consequently, the substrate W is etched more suitably. For example, whether the etching of the blanket portion P1 or protection of the blanket portion P1 from etching is controlled suitably. For example, whether permitting etching of the blanket portion P1 or avoiding etching of the blanket portion P1 is controlled suitably. For example, whether the etching inside of the recess A or protection of the recess A from etching is controlled suitably. For example, whether permitting etching inside of the recess A or avoiding etching inside of the recess A is controlled suitably.

Specifically, when the processing condition information U2 specifies the first etching condition, the anion surfactant K is selected as the additive agent in the switching step. In the processing step, the anion surfactant K and the etching solution are supplied to the substrate W. When the etching solution is supplied to the substrate W, the blanket portion P1 is positively charged. The anion surfactant K and the blanket portion P1 attract each other. Accordingly, the anion surfactant K prevents etching of the blanket portion P1. That is, the anion surfactant K protects the blanket portion P1 from the etching. When the etching solution is supplied to the substrate W, the wall R is negatively charged. The anion surfactant K and the wall R repeal each other. Accordingly, the anion surfactant K permits etching inside of the recess A. This results in easy etching of the substrate W under the first etching condition in the processing step.

Specifically, when the processing condition information U2 specifies the second etching condition, the cation surfactant L is selected as the additive agent in the switching step. In the processing step, the cation surfactant L and the etching solution are supplied to the substrate W. The cation surfactant L and the blanket portion P1 repeal each other. Accordingly, the cation surfactant L permits etching of the blanket portion P1. The cation surfactant L and the wall R attract each other. Accordingly, the cation surfactant L prevents etching inside of the recess A. That is, the cation surfactant L protects the recess A from etching. This results in easy etching of the substrate W under the second etching condition in the processing step.

(1-2) In the switching step, the anion surfactant K or the cation surfactant L is selected as the additive agent in accordance with a target about at least either the etching rate EB of the blanket portion P1 or the etching rate EA in the recess A.

In this modification, the additive agent supplied to the substrate W in the processing step is switched more suitably between the anion surfactant K and the cation surfactant L. Consequently, the substrate W is etched more suitably.

(1-2-1) For example, when the target is to bring the etching rate EB of the blanket portion P1 close to zero, one of the anion surfactant K and the cation surfactant L is selected as the additive agent in the switching step. For example, when the target is to bring the etching rate EA in the recess A close to zero, the other of the anion surfactant K and the cation surfactant L is selected as the additive agent.

In this modification, the additive agent supplied to the substrate W in the processing step is switched more suitably between the anion surfactant K and the cation surfactant L. Consequently, the substrate W is etched more suitably. For example, the etching rate EB of the blanket portion P1 is controlled suitably. For example, the etching rate EA in the recess A is controlled suitably.

Specifically, when the target is to bring the etching rate EB of the blanket portion P1 close to zero, the anion surfactant K is selected as the additive agent in the switching step. In the processing step, the anion surfactant K and the etching solution are supplied to the substrate W. When the etching solution is supplied to the substrate W, the blanket portion P1 is positively charged. The anion surfactant K and the blanket portion P1 attract each other. Accordingly, the anion surfactant K prevents etching of the blanket portion P1. That is, the anion surfactant K reduces the etching rate EB of the blanket portion P1. As a result, the target that the etching rate EB of the blanket portion P1 is brought close to zero is achieved easily in the processing step.

Specifically, when the target is to bring the etching rate EA in the recess A close to zero, the cation surfactant L is selected as the additive agent in the switching step. In the processing step, the cation surfactant L and the etching solution are supplied to the substrate W. When the etching solution is supplied to the substrate W, the wall R is negatively charged. The cation surfactant L and the wall R attract each other. Accordingly, the cation surfactant L prevents etching inside of the recess A. That is, the cation surfactant L reduces the etching rate EA in the recess A. As a result, the target that the etching rate EA in the recess A is brought close to zero is achieved easily in the processing step.

(1-2-2) For example, when the target is to make the etching rate EB lower than the etching rate EA, one of the anion surfactant K and the cation surfactant L is selected as the additive agent in the switching step. For example, when the target is to make the etching rate EA lower than the etching rate EB, the other of the anion surfactant K and the cation surfactant L is selected as the additive agent in the switching step.

In this modification, the additive agent supplied to the substrate W in the processing step is switched more suitably between the anion surfactant K and the cation surfactant L. Consequently, the substrate W is etched more suitably. For example, a level relationship between the etching rate EB and the etching rate EA in the processing step is switched suitably.

Specifically, when the target is to bring the etching rate EB lower than the etching rate EA, the anion surfactant K is selected as the additive agent in the switching step. In the processing step, the anion surfactant K and the etching solution are supplied to the substrate W. When the etching solution is supplied to the substrate W, the blanket portion P1 is positively charged. The anion surfactant K and the blanket portion P1 attract each other. Accordingly, the anion surfactant K prevents etching of the blanket portion P1. When the etching solution is supplied to the substrate W, the wall R is negatively charged. The anion surfactant K and the wall R repeal each other. Accordingly, the anion surfactant K permits etching inside of the recess A. From these results, the target that the etching rate EB is made lower than the etching rate EA is achieved easily in the processing step.

Specifically, when the target is to bring the etching rate EA lower than the etching rate EB, the cation surfactant L is selected as the additive agent in the switching step. In the processing step, the cation surfactant L and the etching solution are supplied to the substrate W. The cation surfactant L and the blanket portion P1 repeal each other. Accordingly, the cation surfactant L permits etching of the blanket portion P1. The cation surfactant L and the wall R attract each other. Accordingly, the cation surfactant L prevents etching inside of the recess A. From these results, the target that the etching rate EA is made lower than the etching rate EB is achieved easily in the processing step.

(1-3) In the switching step, either the anion surfactant K or the cation surfactant L is selected as the additive agent in accordance with the target about the blanket ratio F.

In this modification, the additive agent supplied to the substrate W in the processing step is switched more suitably between the anion surfactant K and the cation surfactant L. Consequently, the substrate W is etched more suitably.

(1-3-1) For example, when the target is to make the blanket ratio F higher than the reference value FT, one of the anion surfactant K and the cation surfactant L is selected as the additive agent. When the target is to make the blanket ratio F lower than the reference value FT, the other of the anion surfactant K and the cation surfactant L is selected as the additive agent.

In this modification, the additive agent supplied to the substrate W in the processing step is switched more suitably between the anion surfactant K and the cation surfactant L.

Consequently, the substrate W is etched more suitably. For example, the blanket ratio F in the processing step is controlled suitably.

Specifically, when the target is to make the blanket ratio F higher than the reference value FT, the anion surfactant K is selected as the additive agent in the switching step. In the processing step, the anion surfactant K and the etching solution are supplied to the substrate W. When the etching solution is supplied to the substrate W, the blanket portion P1 is positively charged. The anion surfactant K and the blanket portion P1 attract each other. Accordingly, the anion surfactant K prevents etching of the blanket portion P1. When the etching solution is supplied to the substrate W, the wall R is negatively charged. The anion surfactant K and the wall R repeal each other. Accordingly, the anion surfactant K permits etching inside of the recess A. From these results, the target that the blanket ratio F is made higher than the reference value FT is achieved easily in the processing step.

Specifically, when the target is to make the blanket ratio F lower than the reference value FT, the cation surfactant L is selected as the additive agent in the switching step. In the processing step, the cation surfactant L and the etching solution are supplied to the substrate W. The cation surfactant L and the blanket portion P1 repeal each other. Accordingly, the cation surfactant L permits etching of the blanket portion P1. The cation surfactant L and the wall R attract each other. Accordingly, the cation surfactant L prevents etching inside of the recess A. From these results, the target that the blanket ratio F is made lower than the reference value FT is achieved easily in the processing step.

(1-3-2) For example, when the target is to make the blanket ratio F higher than 1, one of the anion surfactant K and the cation surfactant L is selected as the additive agent in the switching step. When the target is to bring the blanket ratio F close to zero, the other of the anion surfactant K and the cation surfactant L is selected as the additive agent.

In this modification, the additive agent supplied to the substrate W in the processing step is switched more suitably between the anion surfactant K and the cation surfactant L. Consequently, the substrate W is etched more suitably. For example, the blanket ratio F in the processing step is controlled more flexibly.

Specifically, when the target is to make the blanket ratio F higher than 1, the anion surfactant K is selected as the additive agent in the switching step. In the processing step, the anion surfactant K and the etching solution are supplied to the substrate W. When the etching solution is supplied to the substrate W, the blanket portion P1 is positively charged. The anion surfactant K and the blanket portion P1 attract each other. Accordingly, the anion surfactant K prevents etching of the blanket portion P1. When the etching solution is supplied to the substrate W, the wall R is negatively charged. The anion surfactant K and the wall R repeal each other. Accordingly, the anion surfactant K permits etching inside of the recess A. From these results, the target that the blanket ratio F is made higher than 1 is achieved easily in the processing step.

Specifically, when the target is to bring the blanket ratio F close to zero, the cation surfactant L is selected as the additive agent in the switching step. In the processing step, the cation surfactant L and the etching solution are supplied to the substrate W. The cation surfactant L and the blanket portion P1 repeal each other. Accordingly, the cation surfactant L permits etching of the blanket portion P1. The cation surfactant L and the wall R attract each other. Accordingly, the cation surfactant L prevents etching inside of the recess A. From these results, the target that the blanket ratio F is brought close to zero is achieved easily in the processing step.

(2) In this embodiment, the additive agent may be switched between the anion surfactant K and the cation surfactant L in the switching step in accordance with the first information and the second information. Here, the first information specifies a relationship between the anion surfactant K and the etching rate. The second information specifies a relationship between the cation surfactant L and the etching rate. The first information and the second information are each obtained through experiments and the like. Examples of the first information and the second information are shown in a table in FIG. 7. For example, the memory unit 9 may store the first information and the second information. The controller 10 may acquire the first information and the second information from the memory unit 9. Then, the controller 10 may switch the additive agent between the anion surfactant K the cation surfactant L in accordance with the first information and the second information.

(3) In this embodiment, the memory unit 9 has the processing condition information U2. The memory unit 9 stores the additive agent information U2a. However, the present invention is not limited to this.

For example, the substrate treating apparatus 1 may include an input unit not shown. A user may input the processing condition information U2 or the additive agent information U2a to the input unit. The controller 10 may acquire the processing condition information U2 or the additive agent information U2a from the input unit.

Alternatively, the controller 10 may acquire the processing condition information U2 or the additive agent information U2a from an external device of the substrate treating apparatus 1. The external device is, for example, a host computer that manages the substrate treating apparatus 1.

Likewise, in the modifications (1-2) and (1-3) described above, the controller 10 may obtain the target through various approaches. For example, the controller 10 may acquire the target from the memory unit 9. For example, the controller 10 may acquire the target from the input unit. For example, the controller 10 may acquire the target from the external device of the substrate treating apparatus 1.

(4) The substrate treating method may further include an adjusting step. In the adjusting step, a set value of a concentration of the additive agent relative to the etching solution is changed. For example, the set value of the concentration of the additive agent relative to the etching solution is determined in a range of 1 mM to 100 mM in the adjusting step. In the processing step, the additive agent selected in the switching step is supplied to the substrate W at a concentration equal to the set value determined in the adjusting step. In this modification, the concentration of the additive agent supplied to the substrate W in the processing step is variable suitably. Consequently, the substrate W is etched more suitably.

(5) In the embodiment described above, the wall R is made of silicon dioxide and polysilicon, for example. However, the present invention is not limited to this. The wall R may be made of at least one selected from silicon, silicon dioxide, polysilicon, and hafnium oxide. Even when the wall R is made of at least one selected from silicon, silicon dioxide, polysilicon, and hafnium oxide, the cation surfactant L prevents etching inside of the recess A with the hydrogen peroxide solution suitably.

(6) In the embodiment described above, when the etching solution is supplied to the substrate W, the blanket portion P1 is positively charged. However, the present invention is not limited to this. For example, when the etching solution is supplied to the substrate W, the blanket portion P1 may be negatively charged.

In the embodiment described above, when the etching solution is supplied to the substrate W, the wall R is negatively charged. However, the present invention is not limited to this. For example, when the etching solution is supplied to the substrate W, the wall R may be positively charged.

(7) In the embodiment described above, when the etching solution is supplied to the substrate W, the intermediate part P2 is positively charged. However, the present invention is not limited to this. For example, when the etching solution is supplied to the substrate W, the intermediate part P2 may be negatively charged.

(8) As described in the embodiment, the substrate W treated in the processing step has at least either the blanket portion P1 or the recess A. In other words, the substrate W treated in the processing step may be one selected from a first substrate W1, a second substrate W2, or a third substrate W3. Note that the first substrate W1 has both the blanket portion P1 and the recess A. The second substrate W2 has the blanket portion P1, and does not have the recess A. The third substrate W3 does not have the blanket portion P1, but has the recess A.

(8) In the embodiment described above, the flow path between the nozzle 16 and the supplying sources 28a to 28c is formed by the pipes 21a, 21b, 21c, and 21d, the cross connector 22, and the vales 23a, 23b, and 23c. However, the present invention is not limited to this. The configuration of the flow path between the nozzle 16 and the and the supplying sources 28a to 28c may be changed appropriately.

For example, in the embodiment, the valves 23b and 23c switch the additive agent between the anion surfactant K and the cation surfactant L. However, the present invention is not limited to this. For example, the supplying unit 15 may include a three-way valve for switching the additive agent between the anion surfactant K and the cation surfactant L. The three-way valve is coupled to the supplying source 28b, the supplying source 28c, and the cross connector 22, for example. The three-way valve switches between a first state and a second state. When the three-way valve is under the first state, the three-way valve switches the additive agent to the anion surfactant K. Specifically, when the three-way valve is under the first state, the three-way valve brings the cross connector 22 into fluid communication with the supplying source 28b and blocks the cross connector 22 from the supplying source 28c. When the three-way valve is under the second state, the three-way valve switches the additive agent to the cation surfactant L. Specifically, when the three-way valve is under the second state, the three-way valve blocks the cross connector 22 from the supplying source 28b and brings the cross connector 22 into fluid communication with the supplying source 28c.

For example, in the embodiment, the etching solution and the additive agent are mixed in the cross connector 22. However, the present invention is not limited to this. The supplying unit 15 may include a mixer or a mixing valve for mixing the etching solution and the additive agent.

(9) In the embodiment described above, the supplying unit 15 supplies the mixed liquid of the etching solution and the additive agent to the substrate W. The nozzle 16 dispenses the mixed liquid of the etching solution and the additive agent. However, the present invention is not limited to this. For example, the supplying unit 15 may supply the etching solution and the additive agent individually to the substrate W. The supplying unit 15 may include a first nozzle for only dispensing the etching solution and a second nozzle for only dispensing the additive agent, which illustration is omitted. The etching solution dispensed from the first nozzle and the additive agent dispensed from the second nozzle may be mixed on the substrate W.

(10) In the embodiment, the treating unit 11 is classified as a single-wafer processing unit. However, the present invention is not limited to this. For example, the treating unit 11 may be classified as a batch-type unit. That is, the treating unit 11 may perform treatment on a plurality of substrates W at one time. The treating unit 11 may supply the etching solution and the additive agent to a plurality of substrates W at the same time. For example, the treating unit 11 may include a process tank. The supplying unit 15 may supply the etching solution and the additive agent to the process tank. The treating units 11 may further include a substrate holder for holding a plurality of substrates W at one time. The substrate holder may immerse the substrates W in the mixed liquid of the etching solution and the additive agent stored in the process tank.

(11) The foregoing embodiment and each of the modified embodiments described in paragraphs (1) to (10) above may be further varied as appropriate by replacing or combining their constructions with the constructions of the other modified embodiments.

REFERENCE SIGNS LIST

1 . . . substrate treating apparatus
9 . . . memory unit
10 . . . controller
11 . . . treating unit
15 . . . supplying unit
16 . . . nozzle
A . . . recess
EB etching rate of blanket portion
EA, EA1, EA2, EA3 . . . etching rate in recess
F, F1, F2, F3 . . . blanket ratio
FT, F1T, F2T, F3T . . . reference value
G . . . mixed liquid of etching solution and additive agent
J . . . etching species
K . . . anion surfactant
L . . . cation surfactant
P1 . . . blanket portion
R . . . wall
R1 . . . first wall
R2 . . . second wall
M2 . . . width of recess
U2 . . . processing condition information
U2*a* . . . additive agent information

The invention claimed is:

1. A substrate treating method for performing treatment on a substrate, the substrate treating method comprising:
   a switching step of switching an additive agent between an anion surfactant and a cation surfactant; and
   a processing step of supplying the additive agent, selected in the switching step, and an etching solution to the substrate.

2. The substrate treating method according to claim 1, wherein
   in the switching step, either the anion surfactant or the cation surfactant is selected as the additive agent in accordance with processing condition information for defining a condition of the processing step.

3. The substrate treating method according to claim 2, wherein
   the processing condition information contains additive agent information that specifies the either the anion surfactant or the cation surfactant as the additive agent, and
   the additive agent is switched between the anion surfactant and the cation surfactant in accordance with the additive agent information in the switching step.

4. The substrate treating method according to claim 3, wherein
   the substrate has a blanket portion, and
   the blanket portion is positively charged when the etching solution is supplied to the substrate.

5. The substrate treating method according to claim 3, wherein
   the substrate has a wall defining a recess, and
   the wall is negatively charged when the etching solution is supplied to the substrate.

6. The substrate treating method according to claim 2, wherein
   in the switching step,
      one of the anion surfactant and the cation surfactant is selected as the additive agent when the processing condition information specifies a first etching condition,
      the other of the anion surfactant and the cation surfactant is selected as the additive agent when the processing condition information specifies a second etching condition,
   the first etching condition is to etch an inside of the recess of the substrate while protecting the blanket portion of the substrate from etching, and
   the second etching condition is to etch the blanket portion of the substrate while protecting the recess of the substrate from etching.

7. The substrate treating method according to claim 6, wherein
   the blanket portion is positively charged and a wall of the substrate defining the recess is negatively charged when the etching solution is supplied to the substrate, and
   in the switching step,
      the anion surfactant is selected as the additive agent when the processing condition information specifies the first etching condition, and
      the cation surfactant is selected as the additive agent when the processing condition information specifies the second etching condition.

8. The substrate treating method according to claim 1, wherein
   either the anion surfactant or the cation surfactant is selected as the additive agent in accordance with a target about at least either an etching rate of the blanket portion of the substrate or an etching rate in the recess of the substrate in the switching step.

9. The substrate treating method according to claim 8, wherein
   in the switching step,
      one of the anion surfactant and the cation surfactant is selected as the additive agent when the target is to bring the etching rate of the blanket portion close to zero, and
      the other of the anion surfactant and the cation surfactant is selected as the additive agent when the target is to bring the etching rate in the recess close to zero.

10. The substrate treating method according to claim 8, wherein in the switching step, one of the anion surfactant and the cation surfactant is selected as the additive agent when the target is to make the etching rate of the blanket portion lower than the etching rate in the recess, and the other of the anion surfactant and the cation surfactant is selected as the additive agent when the target is to make the etching rate in the recess lower than the etching rate of the blanket portion.

11. The substrate treating method according to claim 1, wherein in the switching step, either the anion surfactant or the cation surfactant is selected as the additive agent in accordance with a target about a blanket ratio, and the blanket ratio is a ratio of the etching rate in the recess of the substrate relative to the etching rate of the blanket portion of the substrate.

12. The substrate treating method according to claim 11, wherein in the switching step, one of the anion surfactant and the cation surfactant is selected as the additive agent when the target is to make the blanket ratio higher than a reference value, the other of the anion surfactant and the cation surfactant is selected as the additive agent when the target is to make the blanket ratio lower than a reference value, and the reference value is a blanket ratio obtained when the etching solution is supplied to the substrate while the additive agent is not supplied to the substrate.

13. The substrate treating method according to claim 11, wherein in the switching step, one of the anion surfactant and the cation surfactant is selected as the additive agent when the target is to make the blanket ratio higher than 1, and the other of the anion surfactant and the cation surfactant is selected as the additive agent when the target is to bring the blanket ratio close to zero.

14. The substrate treating method according to claim 1, wherein the etching solution is a hydrogen peroxide solution.

15. The substrate treating method according to claim 14, wherein the substrate treated in the processing step has a blanket portion made of titanium nitride.

16. The substrate treating method according to claim 14, wherein the substrate treated in the processing step has a wall that defines a recess and is made of at least one selected from silicon, silicon dioxide, polysilicon, and hafnium oxide.

17. The substrate treating method according to claim 1, further comprising:

an adjusting step of changing a set value of a concentration of the additive agent relative to the etching solution, wherein in the processing step, the additive agent selected in the switching step is supplied to the substrate at a concentration equal to the set value determined in the adjusting step.

18. A substrate treating apparatus, comprising:

a substrate holder configured to hold a substrate;

a supplying unit configured to supply an etching solution and an additive agent to the substrate held by the substrate holder; and a controller configured to control the supplying unit for switching the additive agent between an anion surfactant and a cation surfactant.

* * * * *